US010297474B2

(12) United States Patent
Park et al.

(10) Patent No.: US 10,297,474 B2
(45) Date of Patent: May 21, 2019

(54) CHEMICAL SUPPLIER, PROCESSING APPARATUS INCLUDING THE CHEMICAL SUPPLIER

(71) Applicant: Samsung Electronics Co., Ltd., Suwon-si, Gyeonggi-do (KR)

(72) Inventors: Sang-Jine Park, Yongin-si (KR); Bo-Un Yoon, Seoul (KR); Jeong-Nam Han, Seoul (KR); Kee-Sang Kwon, Seoul (KR); Doo-Sung Yun, Yongin-si (KR); Won-Sang Choi, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 772 days.

(21) Appl. No.: 14/183,994

(22) Filed: Feb. 19, 2014

(65) Prior Publication Data

US 2014/0231010 A1  Aug. 21, 2014

(30) Foreign Application Priority Data

Feb. 19, 2013 (KR) .................. 10-2013-0017306

(51) Int. Cl.
H01L 21/67 (2006.01)

(52) U.S. Cl.
CPC .... *H01L 21/67075* (2013.01); *H01L 21/6708* (2013.01); *H01L 21/67017* (2013.01)

(58) Field of Classification Search
None
See application file for complete search history.

(56) References Cited

U.S. PATENT DOCUMENTS

| 4,955,351 | A | 9/1990 | Lewis et al. |
| 5,462,014 | A * | 10/1995 | Awaya ................ C23C 16/18 118/715 |
| 8,172,641 | B2 * | 5/2012 | Ho .................... B24B 37/015 451/41 |
| 8,225,803 | B2 | 7/2012 | Katsuoka et al. |
| 8,453,599 | B2 | 6/2013 | Yoshihara et al. |
| 2004/0088880 | A1 * | 5/2004 | Yang ................ H01L 21/67034 34/467 |

(Continued)

FOREIGN PATENT DOCUMENTS

| CN | 1685080 A | 10/2005 |
| CN | 101399182 A | 4/2009 |
| JP | 1994-052142 | 7/1994 |
| JP | 09-289158 | 11/1997 |

(Continued)

OTHER PUBLICATIONS

Machine Generated English Translation of KR 100741475. Published Jul. 20, 2007.*

(Continued)

*Primary Examiner* — Sylvia Macarthur
(74) *Attorney, Agent, or Firm* — Lee & Morse, P.C.

(57) ABSTRACT

A chemical supplier includes a chemical reservoir containing a chemical mixture at a room temperature, an inner space of the chemical reservoir being separated from surroundings, a supply line through which the chemical mixture is supplied to a process chamber from the chemical reservoir, an inline heater positioned on the supply line and heating the chemical mixture in the supply line to a process temperature, and a power source driving the chemical mixture to move the chemical mixture toward the process chamber.

21 Claims, 11 Drawing Sheets

(56) References Cited

U.S. PATENT DOCUMENTS

| | | | |
|---|---|---|---|
| 2007/0283983 A1 | 12/2007 | Park et al. | |
| 2008/0295871 A1 | 12/2008 | Nitta et al. | |
| 2009/0032067 A1* | 2/2009 | Kojimaru | H01L 21/67034 134/26 |
| 2009/0084405 A1 | 4/2009 | Kimura et al. | |
| 2010/0136230 A1 | 6/2010 | Moriya et al. | |
| 2011/0030897 A1* | 2/2011 | Terada | H01L 21/31055 156/345.21 |
| 2012/0074102 A1* | 3/2012 | Magara | C11D 7/08 216/83 |
| 2012/0264308 A1* | 10/2012 | Watanabe | H01L 21/6708 438/757 |
| 2014/0231010 A1* | 8/2014 | Park | H01L 21/67075 156/345.11 |
| 2015/0093906 A1* | 4/2015 | Kobayashi | H01L 21/31111 438/748 |
| 2015/0162224 A1* | 6/2015 | Hinode | H01L 29/6653 438/751 |

FOREIGN PATENT DOCUMENTS

| | | |
|---|---|---|
| JP | 2001-076994 | 3/2001 |
| JP | 2002-353186 | 12/2002 |
| KR | 10-2002-0082317 A | 10/2002 |
| KR | 10-2006-0019262 A | 3/2006 |
| KR | 10 2006 0066795 A | 6/2006 |
| KR | 10-0741475 B1 | 7/2007 |
| KR | 10-2009-0022917 A | 3/2009 |
| KR | 10-2009-0029376 A | 3/2009 |
| KR | 10-2011-0019711 A | 2/2011 |

OTHER PUBLICATIONS

Machine Generated English of KR 10-2009-0029376. Held to Jun-Hui Yoon. Published Mar. 23, 2009.*
Machine Generated English of JP09-289158. Held to Isowaki Norio. Published Nov. 4, 1997.*
Korean Office Action dated Mar. 20, 2019.

* cited by examiner

CHEMICAL SUPPLIER, PROCESSING APPARATUS INCLUDING THE CHEMICAL SUPPLIER

CROSS-REFERENCE TO RELATED APPLICATION

Korean Patent Application No. 10-2013-0017306, filed on Feb. 19, 2013, in the Korean Intellectual Property Office, and entitled: "Chemical Supplier, Processing Apparatus Including The Chemical Supplier and Method Of Processing A Substrate Using The Chemical Supplier," is incorporated by reference herein in its entirety.

BACKGROUND

1. Field

Example embodiments relate to a chemical supplier, a processing apparatus including the chemical supplier and a method of processing a substrate using the chemical supplier. More particularly, example embodiments relate to a chemical supplier for a wet etching process and a wafer processing apparatus including the chemical supplier and a method of processing a wafer using the chemical supplier.

2. Description of the Related Art

In general, semiconductor devices have been fabricated through various unit processes such as a deposition process, an etching process, an ion implantation process, a wiring process, and a cleaning process to a semiconductor substrate. Particularly, a wet process has been widely used alone or in conjunction with each of the unit processes for fabricating the semiconductor devices.

SUMMARY

Embodiments are directed to a chemical supplier, including a chemical reservoir containing a chemical mixture at a room temperature, an inner space of the chemical reservoir being separated from surroundings, a supply line through which the chemical mixture is supplied to a process chamber from the chemical reservoir, an inline heater positioned on the supply line and heating the chemical mixture in the supply line to a process temperature, and a power source driving the chemical mixture to move the chemical mixture toward the process chamber.

The chemical reservoir may include a vessel having a source inlet through which chemical sources of the chemical mixture are provided, and a mixture outlet through which the chemical mixture containing the chemical sources is discharged, and a cover combined with the vessel such that the vessel is covered with the cover and the inner space of the chemical reservoir defined by the vessel, and the cover is closed and isolated from surroundings. The cover may include a gas inlet valve through which a pressure control gas is supplied into the reservoir, thereby controlling an inner pressure of the reservoir, and a gas outlet valve through which the pressure control gases are discharged from the reservoir.

The pressure control gas may include one of argon (Ar) gas and nitrogen ($N_2$) gas.

The inline heater may include a heater body, a fine tube provided in the heater body such that the supply line is connected at first and second terminals thereof and through which the chemical mixture flows, a heat transfer member filling up the heater body and surrounding the fine tube, and a heating member that heats the heater transfer member such that heat is transferred to the fine tube from the heat transfer member.

The chemical supplier may further include a chemical nozzle provided at an end portion of the supply line over a substrate in the process chamber such that the chemical nozzle injects the chemical mixture onto the substrate, and a temperature compensator provided on the supply line adjacent to the process chamber, the temperature compensator compensating for a heat loss of the chemical mixture through the supply line.

The temperature compensator may include a pipe through which a heat compensation fluid flows, the pipe enclosing the supply line adjacent to the process chamber, a heat compensation fluid source positioned at a first end portion of the pipe and containing the heat compensation fluid, and a sink positioned at a second end portion of the pipe and receiving the heat compensation fluid.

The heat compensation fluid may include de-ionized water at a temperature of 70° C. to 100° C.

The power source may include an air pump by which an amount of the chemical mixture that is supplied into the process chamber is controlled.

Embodiments are also directed to a chemical supplier including a plurality of source tanks, each source tank of the plurality of source tanks containing a respective chemical source of a plurality of chemical sources, a plurality of source feed lines, each source feed line of the plurality of source feed lines being connected to a respective source tank and having a feeding pump thereon, respective ones of the chemical sources being fed through the respective source feed lines by the feeding pump, a plurality of inline heaters, each inline heater of the plurality of inline heaters being arranged on a respective source feeding line and heating the respective chemical source to a process temperature, a chemical reservoir connected to the source feed lines and mixing the chemical sources at the process temperature into a chemical mixture, an inner space of the chemical reservoir being separated from surroundings, a supply line through which the chemical mixture is supplied to a process chamber from the chemical reservoir, and a power source that drives the chemical mixture to move toward the process chamber.

The chemical supplier may further include a temperature compensator arranged on the supply line adjacent to the process chamber, the temperature compensator compensating for a heat loss of the chemical mixture through the supply line.

The chemical supplier may further include a chemical nozzle arranged over a substrate at an end portion of the supply line, the chemical nozzle injecting the chemical mixture onto the substrate.

The chemical supplier may further include a plurality of first temperature compensators, each first temperature compensator of the plurality of first temperature compensators being arranged on a respective source feed line between the inline heater and the chemical reservoir to compensate for a heat loss of the respective chemical source through the respective source feed line.

The chemical supplier may further include a second temperature compensator arranged on the supply line adjacent to the process chamber, the second temperature compensator compensating for a heat loss of the chemical mixture through the supply line, thereby increasing a temperature of the chemical mixture to the process chamber just before the chemical mixture is injected onto the substrate.

The chemical reservoir may include a vessel containing the chemical mixture therein and a cover combined with the vessel such that the vessel is covered with the cover and the inner space of the chemical reservoir defined by the vessel and the cover is closed and isolated from surroundings, the cover having a gas inlet valve through which pressure control gases are supplied into the reservoir to thereby control an inner pressure of the reservoir and a gas outlet valve through which the pressure control gases are discharged from the reservoir.

Embodiments are also directed to an apparatus for performing a wet process including a process chamber in which a substrate to be processed by a wet process is positioned, a chemical supplier that supplies a chemical mixture to perform the wet process onto the substrate, the chemical supplier including a chemical reservoir containing the chemical mixture and an inline heater for heating the chemical mixture to a process temperature, an inner space of the chemical reservoir being separated from surroundings, and a cleaning solution supplier that supplies a cleaning solution onto the substrate.

The chemical supplier may include a supply line through which the chemical mixture is supplied to the process chamber from the chemical reservoir, the inline heater being arranged on the supply line.

The supply line may be arranged between a single chemical reservoir and a plurality of the process chambers.

The chemical supplier may include a plurality of source tanks, each source tank of the plurality of source tanks containing a respective chemical source of a plurality of chemical sources, and a plurality of source feed lines, each source feed line of the plurality of source feed lines being connected to a respective source tank and feeding the respective chemical source to the chemical reservoir. The inline heater may include a plurality of inline heaters, each inline heater of the plurality of inline heaters being arranged on a respective source feed line such that the chemical sources are heated to a process temperature for the wet process and are mixed with one another into the chemical mixture at the process temperature.

A plurality of the process chambers and a plurality of the chemical reservoirs may be provided in such a configuration that the chemical reservoirs correspond to the process chambers on a one-to-one basis. The chemical mixtures in each of the chemical reservoirs may have different properties, such that a plurality of the wet processes may be performed in each of the process chambers, respectively, independently from one another.

The apparatus may further include a supply line through which respective ones of the chemical mixtures are supplied to the corresponding process chamber from the respective chemical reservoir, and a temperature compensator arranged on the supply line adjacent to the corresponding process chamber and compensating for a heat loss of the respective chemical mixture through the supply line.

The substrate may include a plurality of substrates, and the apparatus may further include a cassette in which the plurality of the substrates is stacked, a transfer unit that loads one substrate of the plurality of substrates into the process chamber from the cassette and unloads the one substrate from the process chamber to the cassette, and a controller that controls the chemical reservoir such that the chemical mixture is injected onto the substrate according to the process steps of the wet process.

The apparatus may include a dry fluid supplier that supplies a dry fluid for removing the cleaning solution from the substrate by drying.

The dry fluid supplier may be integrally arranged with the cleaning solution supplier in one body.

Embodiments are also directed to a method of performing a wet process on a substrate including providing a chemical mixture for the wet process, the chemical mixture being contained in a chemical reservoir at a room temperature, an inner space of the chemical reservoir being separated from surroundings, supplying the chemical mixture from the chemical reservoir to a process chamber in which the substrate is loaded, heating the chemical mixture to a process temperature of the wet process while supplying the chemical mixture to the process chamber, injecting the chemical mixture onto the substrate at the process temperature, and injecting a cleaning solution onto the substrate to remove residuals of the chemical mixture from the substrate.

Supplying the chemical mixture to the process chamber may include discharging the chemical mixture from the chemical reservoir, the discharging being performed by one or more of a pulling pressure applied to a lower portion of the chemical mixture from an exterior of the chemical reservoir and a pushing pressure applied to an upper portion of the chemical mixture in the chemical reservoir.

Heating the chemical mixture may be performed by an inline heater that is arranged on a supply line supplying the chemical mixture to the process chamber from the chemical reservoir.

The method may further include reheating the supply line in which the chemical mixture flows at a location adjacent to the process chamber so as to compensate for a heat loss of the chemical mixture through the supply line.

Embodiments are also directed to a method of performing a wet process on a substrate including providing a chemical mixture for the wet process, the chemical mixture being contained in a chemical reservoir at a process temperature of the wet process, an inner space of the chemical reservoir being separated from surroundings, supplying the chemical mixture from the chemical reservoir to a process chamber in which the substrate is loaded, injecting the chemical mixture onto the substrate at the process temperature, and injecting a cleaning solution onto the substrate to remove residuals of the chemical mixture from the substrate.

Providing the chemical mixture for the wet process in the chemical reservoir at the process temperature may include feeding chemical sources for the chemical mixture to the chemical reservoir through a plurality of source feed lines, and heating the chemical sources to the process temperature by inline heaters that are arranged on respective ones of the source feed lines.

The method may further include heating a supply line through which the chemical mixture flows from the chemical reservoir to the process chamber at a location adjacent to the process chamber so as to compensate for a heat loss of the chemical mixture through the supply line.

Supplying the chemical mixture to the process chamber may include discharging the chemical mixture from the chemical reservoir, the discharging being performed by one or more of a pulling pressure applied to a lower portion of the chemical mixture from an exterior of the chemical reservoir and a pushing pressure applied to an upper portion of the chemical mixture in the chemical reservoir.

Embodiments are also directed to a chemical supplier including a chemical reservoir containing a chemical mixture at a room temperature, an inner space of the chemical reservoir being separated from surroundings, a supply line through which the chemical mixture is supplied to a process chamber from the chemical reservoir, and an inline heater positioned on the supply line and heating the chemical mixture in the supply line to a process temperature, the inline heater including a heater body, a tube having a coil shape inside the heater body, the supply line being connected to the tube such that the chemical mixture flows through the tube, a heat transfer member filling up the heater body and surrounding the tube, and a heating member that heats the heat transfer member such that heat is transferred to the tube from the heat transfer member.

The chemical reservoir may include a gas inlet valve that supplies a pressure control gas into the chemical reservoir, the pressure control gas providing a driving force to move the chemical mixture through the supply line.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
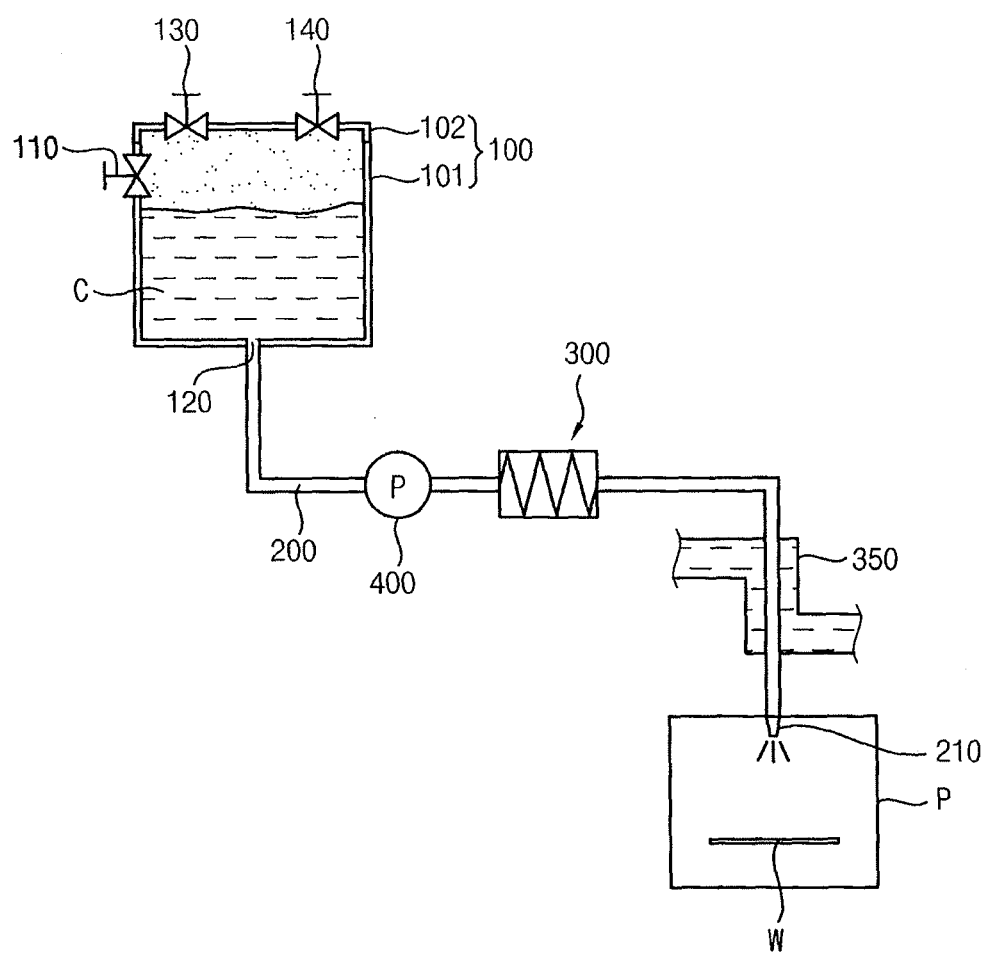
FIG. 1 illustrates a structural view depicting a chemical supplier in accordance with an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element is referred to as being "connected to" or "coupled to" another element, it can be directly on, connected to, or coupled to the other element or intervening elements may be present.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, or section from another region, layer, or section. Thus, a first element, component, region, or section discussed below could be termed a second element, component, region, or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Chemical Supplier

FIG. 1 illustrates a structural view depicting a chemical supplier in accordance with an example embodiment.

Referring to FIG. 1, the chemical supplier 1000 in accordance with an example embodiment may include a reservoir 100 containing a chemical mixture C at room temperature, a supply line 200 through which the chemical mixture C is supplied to a process chamber P from the reservoir 100, an inline heater 300 arranged on the supply line 200 and heating the room temperature chemical mixture C in the supply line 200 to a process temperature, and a power source 400 for driving the chemical mixture C to move toward the process chamber P.

For example, the reservoir 100 may include a vessel 101 containing the chemical mixture C and a cover 102 combined with the vessel 101 to thereby cover the vessel 101 in such a way that vessel 101 is closed and isolated from surroundings. The vessel 101 may include a source inlet 110 through which chemical sources (not shown) of the chemical mixture are provided and a mixture outlet 120 through the chemical mixture C are discharged. The chemical sources may be mixed with one another in the vessel 101. The cover 102 may include a gas inlet valve 140 through which pressure control gases may be supplied into the reservoir 100 thereby controlling an inner pressure of the reservoir 100 above a process pressure and a gas outlet valve 130 through which the pressure control gases may be selectively discharged from the reservoir 100.

The chemical mixture C may be provided by mixing the chemical sources at an exterior of the vessel 101 and then supplying the mixed chemical sources into the vessel 101 through the source inlet 110. In other implementations, the chemical sources may be supplied into the vessel 101 through the source inlet 110 and then may be mixed with one another in the vessel 101 to provide the chemical mixture C in the reservoir 100.

The chemical mixture C may be varied according to the wet process to be performed on the substrate W. For example, when performing a wet etching process on the substrate W, the chemical mixture C may be provided to have such a composition that layers on the substrate W are etched off at a sufficient etching rate with a sufficient etching selectivity. On the other hand, when performing a wet cleaning process after completing a unit process for fabricating a semiconductor device, the chemical mixture C may be provided to have such a composition that contaminants, residuals, and/or particles of the unit process are sufficiently cleaned off from the substrate W. In the present example embodiment, the chemical mixture C may include a standard cleaning 1 (SC-1) solution including hydrogen fluoride (HF) or sulfur hexafluoride ($SF_6$) and an aqueous ammonium hydroxide ($NH_4OH$) solution.

The chemical mixture C may be provided as a solution in which at least one of the chemical sources is dissolved in a solvent in which the vapor pressure of the chemical sources is different from that of the solvent. Thus, in case that the vessel 101 containing the chemical mixture C is open without the cover 102, any one of the chemical sources and the solvent may be evaporated from the vessel 101, and thus, the chemical and physical properties of the chemical mixture C may be changed thereby. In such a case, the chemical mixture C may have a limited lifetime and may have to be discarded after such lifetime. As a result, the wet process using the chemical mixture C would be limited to being performed within the lifetime of the chemical mixture C.

According to embodiments, however, the reservoir 100 may include the cover 102 for covering a top portion of the vessel 101 and for isolating an inner space of the vessel 101 from the surroundings. Thus, the chemical mixture C may be isolated from the surroundings and the components of the chemical mixture C may be sufficiently prevented from evaporating into an atmosphere. In addition, an empty portion of the inner space that is not filled with the chemical mixture C may be filled up with the pressure control gases under a high pressure. Thus, the chemical mixture C may be further prevented from evaporating. The ambient pressure around the chemical mixture C may be increased to such a sufficient degree that the compositions of the chemical mixture C is not evaporated, which may help to prolong the lifetime of the chemical mixture C.

The ambient pressure around the chemical mixture C may be provided as an inner pressure of the reservoir 100 at an upper portion of the vessel 101. Accordingly, the chemical mixture C may be sufficiently discharged from the reservoir 100 at a lower portion of the vessel 101 without requiring any additional discharging force, such as a driving pump.

For example, the source inlet 110 may include a ball valve positioned at a lower portion of a sidewall of the vessel 101, and the mixture outlet 120 may include a gate valve at the lower portion of the vessel 101. The ball valve may be selectively closed or opened according to operation conditions and may have good sealing characteristics. The gate valve may be selectively operated according to the power source 400. The chemical mixture C may be directly provided into the vessel 101 when the cover 102 is removed. In other implementations, the chemical mixture C may also be provided into the vessel 101 through the source inlet 110.

The gas inlet valve 140 may include a check valve by which the pressure control gases flow only in a direction into the reservoir 100 from the exterior of the reservoir 100. Thus, when the vessel 101 is covered with the cover 102 and the inner space of the vessel 101 is separated and isolated from surroundings, the pressure control gases may flow into the vessel 101 through the gas inlet valve 140 in such a way that the inner pressure of the reservoir 100 may reach a preset high pressure. Therefore, the chemical mixture C may be on standby in the reservoir 100 under the high pressure until the wet process is initiated. A transfer time of moving the chemical mixture C from the reservoir 100 to the process chamber P may be varied according to the inner pressure of the reservoir 100. Thus, the inner pressure of the reservoir 100 may be controlled to be uniform so as to uniformly move the chemical mixture C to the process chamber P from the reservoir 100. When the empty portion of the inner space of the reservoir 100 increases, the pressure control gases may be automatically provided into the reservoir 100 so as to maintain a uniform inner pressure of the vessel 101.

The pressure control gases may include inactive gases that do not react with the chemical mixture C in the reservoir 100. Examples of the inactive gases may include argon (Ar) gas, nitrogen ($N_2$) gas, etc. These may be used alone or in combinations thereof.

The gas outlet valve 130 may function as a safety valve for protecting the reservoir 100 from an abnormal increase of the inner pressure of the reservoir 100. When the inner pressure of the reservoir 100 exceeds a critical pressure, for example, an allowable maximal pressure of the combination of the vessel 101 and the cover 102, the gas outlet valve 130 may be automatically opened and the pressure control gases may be discharged from the reservoir 100 through the gas outlet valve 130. The gas outlet valve 130 is not operated under normal operation states of the chemical supplier 1000.

The vessel 101 and the cover 102 may have a sufficient rigidity to resist the inner pressure of the reservoir 100. The vessel 101 and the cover 102 may include materials that hardly react with the chemical mixture C in the reservoir 100. For example, the vessel 101 and the cover 102 may include a stainless steel or a polymer resin having a sufficient rigidity. A sealing member (not shown) may be further provided at a boundary portion of the vessel 101 and the cover 102, which may help to improve the sealing characteristics of the reservoir 100.

The supply line 200 may include pipe lines connecting the reservoir 100 and the process chamber P. The chemical mixture C may move into the process chamber P from the reservoir 100 through the pipe lines. The supply line 200 has a sufficient rigidity to resist a discharge pressure of the chemical mixture C and a sufficient chemical resistance with respect to the chemical mixture C for preventing the chemical reaction between the pipe line and the chemical mixture C. For example, the supply line 200 may include a fluoride resin such as TEFLON, styrene resin having good rigidity and flexibility, or a polyamide resin. Further, a supplemental layer for reinforcing the rigidity and the chemical resistance may be coated on an inner surface of the supply line 200. The supplemental layer may include a painting layer or a rubber layer.

The power source 400 and the inline heater 300 may be arranged on the supply line 200. The power source 400 may provide a driving power to move the chemical mixture C to the process chamber P. The chemical mixture C in the supply line 200 may be heated to the process temperature by the inline heater 300.

The chemical mixture C in the reservoir 100 may be forced to move toward the process chamber P by the power source 400. Various types of driving power may be used for the power source 400 as long as the chemical mixture C is moved to the process chamber P at a sufficient velocity in the wet process.

In the present example embodiment, the power source 400 may include at least one of a pulling pressure applier and a pushing pressure applier. A pulling pressure may be applied to a lower portion of the chemical mixture C from an exterior of the reservoir 100 by the pulling pressure applier, and thus the chemical mixture C may be pulled outwards from the reservoir 100. A pushing pressure may be applied to an upper portion of the chemical mixture C in the reservoir 100 by the pushing pressure applier, and thus the chemical mixture C may be pushed out from the reservoir 100.

For example, the pulling pressure applier may include a pump system that is installed on the supply line 200 and may pump out the chemical mixture C from the reservoir 100. The pushing pressure applier may include the control pressure gases that flow into the reservoir 100 through the gas inlet valve 140. The pump system may include an air pump by which the chemical mixture C is pulled out from the reservoir 100 by applying an air pressure to the chemical mixture C or a vacuum pump by which the chemical mixture C is pulled out from the reservoir 100 by using a pressure differential between the reservoir 100 and the supply line 200. Further, a mass flow controller may be provided with the power source 400 for controlling the mass flux of the chemical mixture C flowing through the supply line 200.

When the inner pressure of the reservoir 100 is high enough to push and move the chemical mixture C to the process chamber P, no additional pump systems may be needed for discharging and moving the chemical mixture C to the process chamber P. Thus, the control of the inner pressure of the reservoir 100 may be sufficient to move the chemical mixture C to the process chamber P without any additional pumping pressure.

In the present example embodiment, the chemical mixture C may be discharged from the reservoir 100 by a pump system and may move to the process chamber P through the supply line 200. The inner pressure of the reservoir 100 may increase the velocity of the chemical mixture C moving in the supply line 200, which may help to improve the transfer efficiency of the chemical mixture C between the reservoir 100 and the process chamber P.

A supplemental pump system may be installed on the supply line 200 for improving the transfer efficiency of the chemical mixture C.

No internal chemical circulation circuit for heating the chemical mixture C in the standby state is provided for the chemical supplier 1000. Accordingly, the chemical mixture C in the reservoir 100 may be at room temperature in the standby state. The chemical mixture C may be heated to the process temperature by the inline heater 300 on the supply line 200 while the chemical mixture C flows through the supply line 200. Thus, the chemical mixture C may be supplied into the process chamber P at a process temperature that is higher than the room temperature.

The inline heater 300 may be installed on the supply line 200. The inline heater 300 may heat the chemical mixture C to the process temperature for a short time without any disturbance to the flow of the chemical mixture C in the supply line 200.

Figure 2:
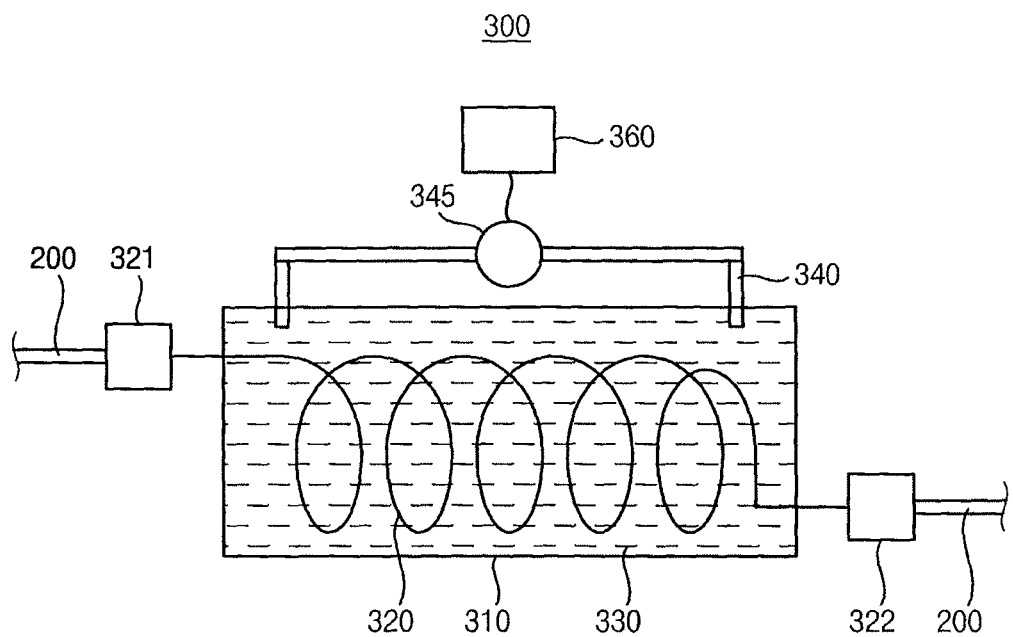
FIG. 2 illustrates a structural view depicting the inline heater of the chemical supplier shown in FIG. 1.

FIG. 2 illustrates a structural view depicting the inline heater of the chemical supplier shown in FIG. 1.

Referring to FIG. 2, the inline heater 300 may include a heater body 310, a coil-shaped fine tube 320 arranged in the heater body 310 in such a way that the supply line 200 is connected thereto and through which the chemical mixture C flows, a heat transfer member 330 filling up the heater body 310 and enclosing the fine tube 320, and a heating member 340 that heats the heater transfer member 330. The fine tube 320 may include first and second terminals 321 and 322 that are connected to the supply line 200. Heat may be transferred into the fine tube 320 from the heat transfer member 330.

For example, the heat transfer member 330 may include a heat conductive fluid filling up an inside of the heater body 310, and the fine tube 320 may be immersed in the heat conductive fluid. The chemical mixture C may flow into the coil-shaped fine tube 320 at the first terminal 321 and may flow out of the coil-shaped fine tube 320 at the second terminal 322.

The heating member may generate Joule's heat, and the heat transfer member 330 may be heated to a preset high temperature by the Joule's heat. The heat may be transferred to the chemical mixture C flowing in the fine tube 320 from the heat transfer member 330. The chemical mixture C may be heated to the process temperature by the time the chemical mixture reaches the second terminal 322 of the fine tube 320. The fine tube 320 may be shaped into a coil so as to enlarge the surface area of the fine tube 320 making contact with the heat transfer member 330.

The heating member 340 may be operated by electrical power 345 and may transform electrical energy into heat energy that may be transferred to the heat transfer member 330. The electrical power 345 may be controlled by a heat controller 360, and thus, the amount of the electrical energy applied to the heating member 340 may be sufficiently controlled. The temperature of the chemical mixture C may be accurately controlled by the heat controller 360.

While the present example embodiment discloses that the supply line 200 is connected to the coil-shaped fine tube 320 and is indirectly heated by the heat transfer member 330, the inline heater 300 may have any other suitable modifications according to the structure and material property of the supply line 200 and the efficiency of the heat transfer.

For example, a plurality of the fine tubes 320 may be positioned inside of the heater body 310 for shortening the heating time of the chemical mixture C. In other implementations, the inline heater 300 may be modified in such a way that no fine tube is provided. The supply line 200 may dip into the heat transfer member 330. In other implementations, the heating member 340 may be installed inside the supply line 200, and thus, the chemical mixture C in the supply line 200 may be directly heated by the heating member 340.

A chemical nozzle 210 may be provided at an end portion of the supply line 200 and the high temperature chemical mixture C may be injected onto the substrate W in the process chamber P. For example, the substrate W may be rotated at a preset angular speed and the chemical mixture C may be injected onto the rotating substrate W. Thus, the chemical mixture C may be uniformly supplied to a whole surface of the substrate W and a chemical treatment may be uniformly performed on the whole surface of the substrate W.

A temperature compensator 350 may be further provided with the supply line 200 adjacent to the process chamber P. The temperature compensator may compensate for heat loss of the chemical mixture C through the supply line 200.

Figure 3:
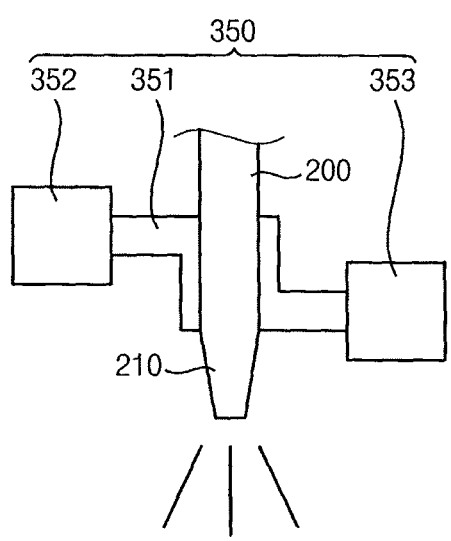
FIG. 3 illustrates a structural view depicting a temperature compensator of the inline heater shown in FIG. 2.

FIG. 3 illustrates a structural view depicting a temperature compensator of the inline heater shown in FIG. 2.

Referring to FIG. 3, the temperature compensator 350 may include an additional pipe 351 enclosing the supply line 200 adjacent to the process chamber P and through which a heat compensation fluid F may flow, an additional source 352 containing the heat compensation fluid F, and an additional sink 353 receiving the heat compensation fluid F. The temperature of the heat compensation fluid F may be higher than that of the chemical mixture C, and thus, the heat may be transferred to the chemical mixture C from the heat compensation fluid F. Heat loss in the chemical mixture C may be compensated by heat transfer from the heat compensation fluid F. The additional source 352 may be positioned at a first end of the additional pipe 351 and the additional sink 353 may be positioned at a second end of the additional pipe 351. The heat compensation fluid F may flow through the additional pipe 351 from the additional source 352 to the additional sink 353.

For example, de-ionized water may be heated to a temperature of about 70° C. to about 100° C. in the additional source 352 as the heat compensation fluid F and may flow into the additional pipe 351 according to a compensation signal of the temperature compensator 350. The high temperature de-ionized water may be received in the additional sink 353. The supply line 220 adjacent to the chemical nozzle 210 may penetrate through the additional pipe 351. The additional source 352 and the additional sink 353 may be connected to an additional heater (not shown). The heat compensation fluid F may circulate between the additional source 352 and the additional sink 353. The additional source 352, the additional sink 353, the additional heater, and the additional pipe 351 may constitute a closed circulation circuit of the heat compensation fluid F. While the heat compensation fluid F flows through the additional pipe 351 to the additional sink 353, the temperature of the heat compensation fluid F may decrease due to the heat transfer to the chemical mixture C in the supply line 200. Then, the low temperature heat compensation fluid F may be forced to flow again to the additional source 352 through the closed circulation circuit while being heated to the high temperature of about 70° C. to about 100° C. by the additional heater.

The heat loss of the chemical mixture C may be compensated in the additional pipe 351 through which the supply line 200 penetrates. In the present example embodiment, the heat may be transferred to the chemical mixture C from the de-ionized water in the additional pipe 351, thereby compensating for the heat loss of the chemical mixture C. The temperature compensator 350 may be supplementally provided so as to compensate for the heat loss of the chemical mixture C through the supply line 200. Accordingly, a smaller heat transfer unit than the inline heater 300 may be sufficient for the temperature compensator 350.

When the chemical mixture C is individually supplied to respective ones of a plurality of process chambers P from the single reservoir 100, the temperature compensator 350 may be provided with respect to each process chamber P. Thus, the chemical mixture C may be controlled to have the process temperature shortly before the injection onto the substrate W, which may help to increase the accuracy and promote the completion of the wet process using the chemical mixture C.

While the present example embodiment discloses the de-ionized water as the heat compensation fluid F, any other suitable materials or fluids may be utilized for compensating the heat loss of the chemical mixture C through the supply line 200 according to the structure of the chemical supplier 1000 and operation requirements of the wet processing apparatus having the chemical supplier 1000.

According to example embodiments of the chemical supplier 1000, the chemical mixture C may be contained in the reservoir 100 at room temperature under the standby state of the wet process. Thus, evaporation of the chemical mixture C may be minimized in the standby state, and the lifetime of the chemical mixture C may be sufficiently extended. In addition, the chemical mixture C may be rapidly heated to the process temperature by the inline heater 300 at a time when the chemical mixture C moves to the process chamber P from the reservoir 100. Further, the temperature compensator 350 may be provided to the supply line 200 adjacent to the process chamber P, thereby sufficiently compensating for heat loss of the chemical mixture C through the supply line 200. Accordingly, the consumption of the chemical mixture C may be reduced in the wet process, and the temperature of the chemical mixture C may be accurately controlled for the wet process using the chemical mixture C.

Figure 4:
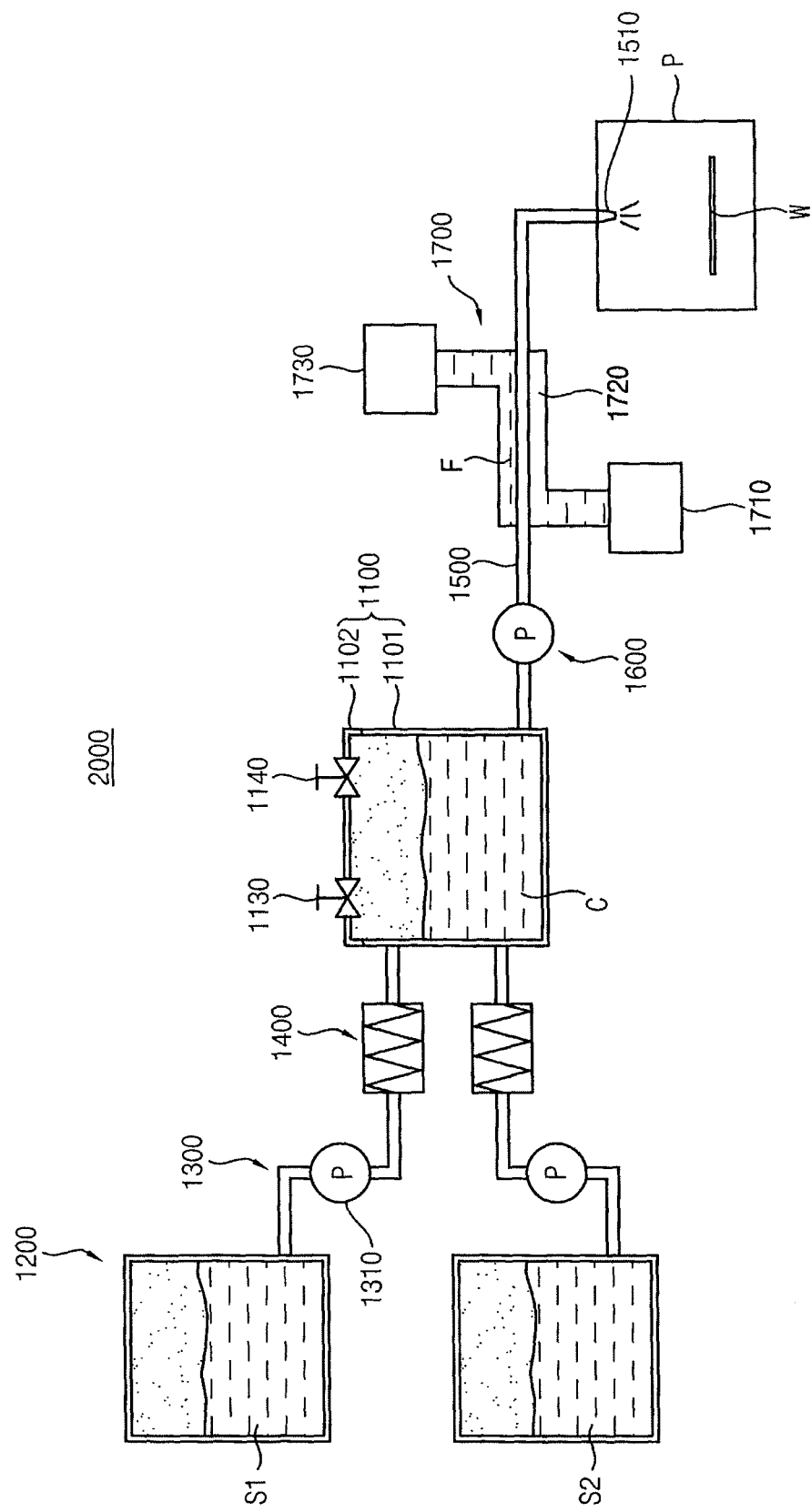
FIG. 4 illustrates a structural view depicting a chemical supplier in accordance with another example embodiment.

FIG. 4 illustrates a structural view depicting a chemical supplier in accordance with another example embodiment.

Referring to FIG. 4, the chemical supplier 2000 in accordance with this example embodiment may include a plurality of source tanks 1200, each containing a respective one of chemical sources S1 and S2, a plurality of source feed lines 1300 each of which is connected to a respective one of the source tanks. The chemical supplier 2000 may further include a feeding pump 1310 for feeding the respective chemical source S1 or S2 thereon, a plurality of inline heaters 1400 arranged on respective ones of the source feeding lines to heat the chemical sources S1 and S2 to a process temperature, a reservoir 1100 connected to the feeding lines 1300 in which the chemical sources S1 and S2 are mixed under the process temperature into a chemical mixture C, a supply line 1500 through which the chemical mixture C is supplied to a process chamber P from the reservoir 1100, and a power source 1600 for driving the chemical mixture C to move toward the process chamber P.

The chemical supplier 2000 in FIG. 4 may have substantially the same configuration and structure as the chemical supplier 1000 shown in FIG. 1, except that the inline heater 1400 may be arranged on the source feeding lines 1300. Thus, the chemical mixture C may be controlled to be at a high temperature in the reservoir 1100.

The chemical sources S1 and S2 may be individually contained in the source tanks 1200, respectively, and thus may be individually fed into the reservoir 1100 through the respective source feeding line 1300. Each source tank 1200 may include a closed container or an open container and may be made of a material that hardly reacts with the respective chemical source S1 or S2. The source tank 1200 may have chemical stability with respect to the respective chemical source S1 or S2. While the present example embodiment discloses a pair of the source tanks 1200 in which first and second chemical sources S1 and S2 may be contained, it is to be understood that three or more source tanks may be connected to the reservoir 1100 according to the number of compositions of the chemical mixture C, which also may be three or more. The chemical sources S1 and S2 may be maintained under a room temperature and may be forced to move to the reservoir 1100 by the feeding pump 1310.

While being fed to the reservoir 1100, the chemical sources S1 and S2 may be heated to the process temperature, which is higher than the room temperature, by the inline heater 1400. Thus the chemical sources S1 and S2 may reach the reservoir 1100 at the process temperature. The inline heater 1400 may have substantially the same structure as the inline heater 300 of the chemical supplier 1000 shown in FIG. 1.

The chemical sources S1 and S2 may be mixed with each other in the reservoir 1100 at the process temperature, thereby forming the chemical mixture C under the process temperature in the reservoir 1100. The chemical mixture C may be in a standby state in the reservoir 1100 at the process temperature for the wet process.

The reservoir 1100 may have substantially the same structures as the reservoir 100 of the chemical supplier 1000. The reservoir 1100 may be closed from surroundings. The reservoir 1100 may include an open vessel 1101 containing the chemical mixture C and a cover 1102 covering the vessel 1101 in such a way that an inner space of the vessel 1101 is separated and isolated from surroundings such that the reservoir 1100 is closed from the surroundings. Just like the cover 102 of the reservoir 100 shown in FIG. 1, the cover 1102 may include a gas inlet valve 1140 through which pressure control gases may be supplied into the reservoir 1100 thereby controlling an inner pressure of the reservoir 1100 above the process pressure and a gas outlet valve 1130 through which the pressure control gases may be selectively discharged from the reservoir 1100.

Although the chemical mixture C may be more likely to evaporate in the reservoir 1100 than in the reservoir 100 shown in FIG. 1 due to the high temperature, the cover 1102 and the pressure control gases in the reservoir 1100 may sufficiently prevent the evaporation of the chemical mixture C. Therefore, the properties of the chemical mixture C may hardly change and the lifetime of the chemical mixture C may be prolonged.

The chemical mixture C may be contained in the reservoir 1100 at the process temperature. Accordingly, the reservoir 1100 may be provided to have excellent chemical resistance with respect to the chemical mixture C. For example, a paint or rubber having excellent chemical resistance may be coated on inner surfaces of the vessel 1101 and the cover 1102 defining the inner space of the reservoir 1100.

The gas inlet valve 1140 and the gas outlet valve 1130 may have substantially the same structures as the gas inlet valve 140 and the gas outlet valve 130 of the reservoir 100 shown in FIG. 1, except the inner surfaces may be coated with the paint or the rubber. Thus, the chemical mixture C may be stably contained in the reservoir 1100 without any chemical reactions with the reservoir 1100, in spite of the high temperature thereof.

The chemical mixture C in the reservoir 1100 may be supplied into the process chamber P through the supply line 1500. A power source 1600, such as an air pump, may drive the chemical mixture C to move towards the process chamber P through the supply line 1500. The chemical mixture C may be forced to move towards the process chamber P. When driven to move to the process chamber P, the chemical mixture C may be accelerated by the inner pressure of the reservoir 1100, which may help to improve a transfer speed of the chemical mixture C to the process chamber P. When the inner pressure in the reservoir 1100 is sufficiently high, no additional driving power may be needed to move the chemical mixture C to the process chamber P.

The power source 1600 may include at least one of a pulling pressure applier and a pushing pressure applier. A pulling pressure may be applied to a lower portion of the chemical mixture C from an exterior of the reservoir 1100 by the pulling pressure applier, and thus, the chemical mixture C may be pulled out from the reservoir 1100. A pushing pressure may be applied to an upper portion of the chemical mixture C in the reservoir 1100 by the pushing pressure applier, and thus, the chemical mixture C may be pushed out from the reservoir 1100. For example, the pulling pressure applier may include a pump system such as an air pump or a vacuum pump, and the pushing pressure applier may include the control pressure gases that flow into the reservoir 1100 through the gas inlet valve 1140 and a controller for operating the gas inlet valve 1140. The supply line 1500 and the power source 1600 may have substantially the same structures as the supply line 200 and the power source 300 of the chemical supplier 1000 shown in FIG. 1. Thus, similar descriptions of the supply line 1500 and the power source 1600 will not be repeated.

A temperature compensator 1700 may be further provided with the supply line 1500 adjacent to the process chamber P to compensate for the heat loss of the chemical mixture C through the supply line 1500. The temperature compensator 1700 may include an additional pipe 1720 enclosing the supply line 1500 adjacent to the process chamber P and through which a heat compensation fluid F flows, an additional source 1710 containing the heat compensation fluid F, and an additional sink 1730 receiving the heat compensation fluid F. The temperature of the heat compensation fluid F may be higher than that of the chemical mixture C, and thus, heat may be transferred to the chemical mixture C from the heat compensation fluid F. Heat loss of the chemical mixture C may be compensated for by heat transfer from the heat compensation fluid F. The additional source 1710 may be positioned at a first end of the additional pipe 1720, and the additional sink 1730 may be positioned at a second end of the additional pipe 1710. Thus, the heat compensation fluid F may flow through the additional pipe 1720 from the additional source 1710 to the additional sink 1730. The temperature compensator 1700 may be arranged on the supply line 1500 close to the chemical nozzle 1510, so that, in spite of heat loss of the chemical mixture C through the supply line 1500, the temperature of the chemical mixture C may be close to the process temperature just before the injection onto the substrate W.

The temperature compensator 1700 may have substantially the same as structures as the temperature compensator 350 of the chemical supplier 1000 shown in FIG. 1, and thus, similar descriptions will not be repeated.

According to example embodiments of the chemical supplier 2000, although the chemical mixture C is contained in the reservoir 100 at a high temperature under the standby state of the wet process, the evaporation of the chemical mixture C may be minimized at the standby state since the reservoir 1100 may be sufficiently covered and isolated from surroundings, which may help to prolong the lifetime of the chemical mixture C. Particularly, the high temperature chemical mixture C may be in a standby state without any additional internal circulation circuit for periodically heating the chemical mixture C in the reservoir 1100, which may help to reduce maintenance and operation costs of the wet process apparatus using the chemical mixture C together with the consumption of the chemical mixture C for the wet process.

Further, the chemical sources may be heated to a high temperature prior to forming the chemical mixture C in the reservoir 1100. Accordingly, no inline heater may be needed on the supply line 1500. A plurality of the reservoirs 1100 may be connected to a plurality of the process chambers P, respectively, on a one-to-one basis. In such a case, each of the process chambers P may be operated independently from one another under the respective operation condition.

Figure 5:
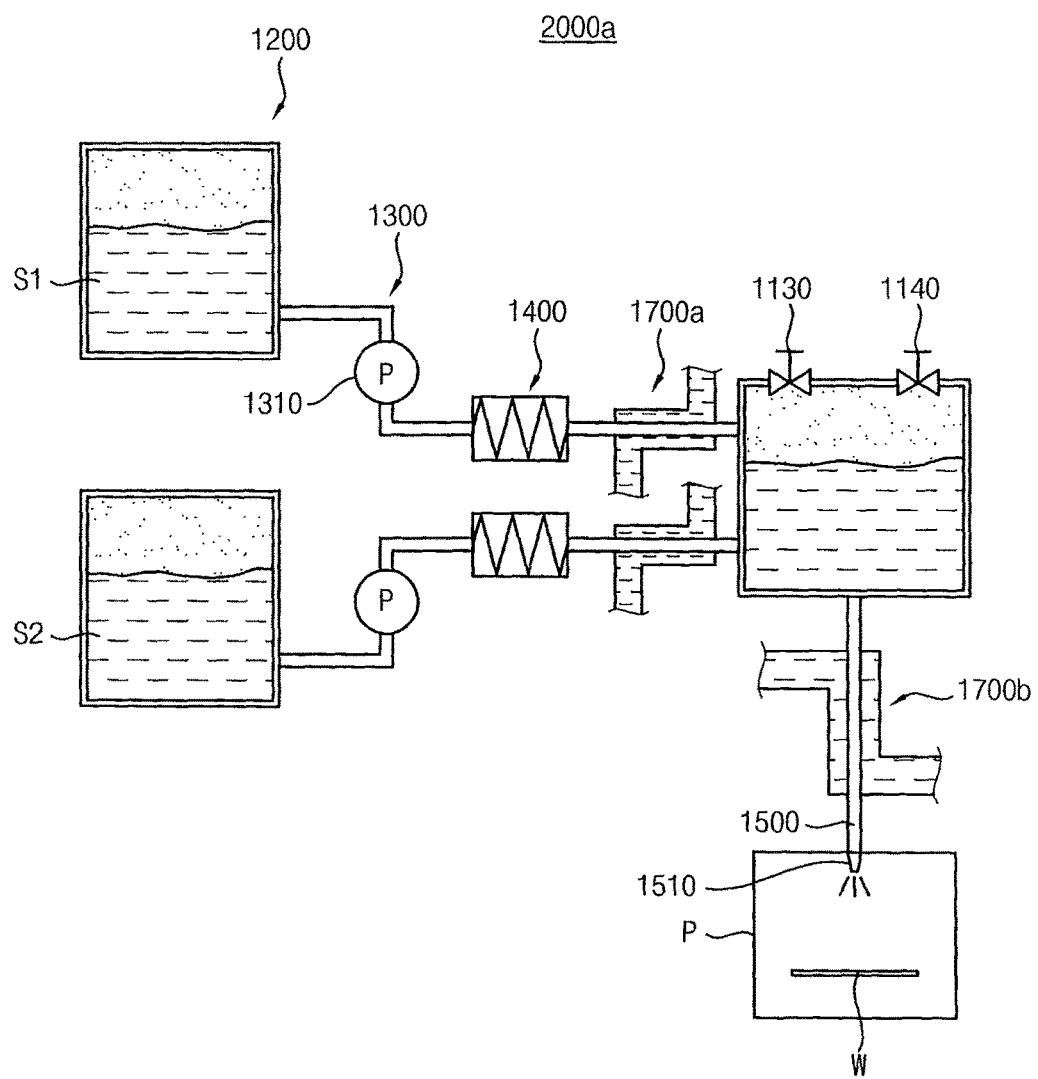
FIG. 5 illustrates a structural view depicting a modification of the chemical supplier shown in FIG. 4.

FIG. 5 illustrates a structural view depicting a modification of the chemical supplier shown in FIG. 4.

Referring to FIG. 5, the chemical supplier 2000*a* may differ from the chemical supplier 2000 illustrated in FIG. 4 in that the reservoir 1100 may be positioned over the process chamber P to minimize the length of the supply line 1500. Thus, the heat loss through the supply line 1500 may be minimized while the chemical mixture C is supplied into the process chamber P from the reservoir 1100.

The chemical mixture C in the reservoir 100 of the chemical supplier 1000 shown in FIG. 1 may need to be heated to the process temperature from the room temperature as a short a time as possible, and thus, the heat transfer may be conducted as rapidly as possible between the supply line 200 and the inline heater 300. Therefore, the inline heater 300 may be configured as a complicated structure and may have a sufficiently large size corresponding to the high heat transfer rate. For those reasons, it may be difficult to arrange the inline heater 300 on or adjacent to the individual process chamber P. The inline heater 300 may be spaced apart from the process chamber P by a sufficient gap distance and the additional supply line 200 may be provided between the reservoir 100 and the process chamber P.

In the chemical supplier 2000/2000*a* in FIGS. 4 and 5, on the other hand, the chemical mixture C may be in a standby state at the process temperature. Thus, no inline heater may be needed on the supply line 1500 between the reservoir 1100 and the process chamber P. Therefore, the reservoir 1100 may be positioned as close to the process chamber P as possible and thus, the gap distance between the reservoir 1100 and the process chamber P may be minimized. A plurality of the reservoirs 1100 may be provided in the chemical supplier 2000 corresponding to a plurality of process chambers P, and thus the process chambers P may correspond to the reservoirs 1100 on a one-to-one basis.

In addition, the length of the supply line 1500 may be shortened as much as possible between the reservoir 1100 and the process chamber P, and thus the heat loss of the chemical mixture C through the supply line 1500 may also be minimized. According to an implementation, the reservoir 1100 may be positioned on an outer surface of the process chamber P.

A first temperature compensator 1700*a* may be selectively arranged on the source feed line 1300 between the reservoir 1100 and the inline heater 1400. Thus, a heat loss of the chemical sources S1 and S2 through the source feed lines 1300 may be sufficiently compensated for while the chemical sources S1 and S2 are fed into the reservoir 1100. If the gap distances between the reservoir 1100 and the source tanks 1200 are different from each other, due to differing locations of each source tank 1200, the temperature of the chemical sources S1 and S2 may also be different from each other when the chemical sources S1 and S2 reach the reservoir 1100. Thus, it may be difficult to provide a uniform process temperature of the chemical mixture C in the reservoir 1100. In such a case, the first temperature compensators 1700*a* arranged on each source feed line 1300 may individually compensate for the heat loss of the chemical sources S1 and S2 through the respective source feed line 1300, so that the chemical sources S1 and S2 may have a uniform temperature corresponding to the process temperature. The temperature of the chemical mixture C may be uniform in the reservoir 1100 irrespective of the gap distances between the reservoir 1100 and the source tanks 1200.

Further, a second temperature compensator 1700*b* may be further arranged on the supply line 1500 between the reservoir 1100 and the process chamber P, and thus the heat loss of the chemical mixture C through the supply line 1500 may be sufficiently compensated for while the chemical mixture C is supplied into the process chamber P. Therefore, the temperature of the chemical mixture C may be accurately controlled close to the process temperature of the wet process using the chemical mixture C. For example, the temperature of the heat compensation fluid F in the second temperature compensator 1700*b* may be controlled to be a little bit over the process temperature of the wet process using the chemical mixture C, so that the temperature of the chemical mixture C be come close to the process temperature just before the injection of the chemical mixture C onto the substrate W.

Accordingly, the temperature of the chemical mixture C may be controlled to be uniform at the process temperature irrespective of the gap distances between the reservoir 1100 and the source tanks 1200.

Further, when a plurality of the reservoirs 1100 are connected to a plurality of the process chambers P on a one-to-one basis, the chemical sources S1 and S2 may be individually fed to each of the reservoirs 1100 with different conditions. Thus, the chemical mixtures C in each of the reservoirs 1100 may have different properties. The chemical sources S1 and S2 may be fed into each of the process chambers P at a different speed and mass flux such that the chemical mixtures C in each of the reservoirs 1100 may have different compositions, concentrations, and process temperatures. Accordingly, a plurality of the wet processes may be performed in the process chambers P, respectively, under different conditions.

Apparatus for Performing a Wet Process Having the Chemical Supplier

Figure 6:
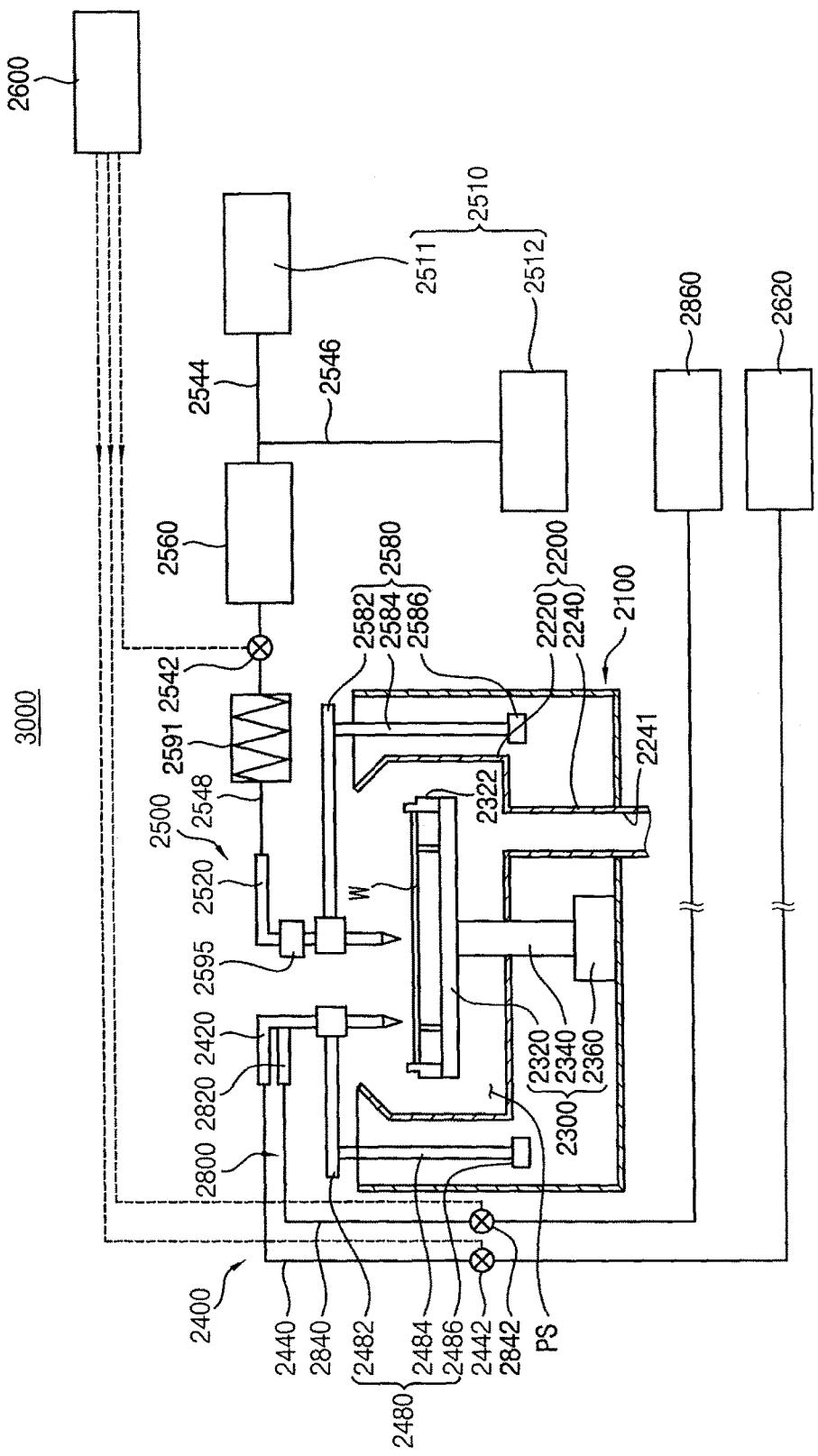
FIG. 6 illustrates a structural view depicting an apparatus for performing a wet process having the chemical supplier shown in FIG. 1.

FIG. 6 illustrates a structural view depicting an apparatus for performing a wet process having the chemical supplier shown in FIG. 1.

Referring to FIG. 6, an apparatus 3000 for performing a wet process (hereinafter referred to as wet process apparatus) in accordance with an example embodiment may include at least a process chamber 2100 having a substrate W to be processed by a wet process, a chemical supplier 2500 that supplies a chemical mixture onto the substrate W, and a cleaning solution supplier 2400 that supplies a cleaning solution onto the substrate W. The chemical supplier 2500 may include a reservoir 2560 containing the chemical mixture for the wet process and an inline heater 2591 for heating the chemical mixture to a process temperature.

The process chamber 2100 may include a process space PS in which the wet process is performed and a support 2300 on which the substrate W is positioned. For example, the support 2300 may include a spin chuck 2320, a rotating shaft 2340, and a driving motor 2360. The substrate W may be loaded onto the spin chuck 2320 and may be mechanically fixed to the spin chuck 2320 by a clamp 2322 arranged at a peripheral portion of the spin chuck 2320. The rotating shaft may penetrate through a central portion of the spin chuck 2320 and may be rotated by a driving motor 2360, such that the spin chuck 2320 may be rotated at a constant angular speed. In the present example embodiment, the wet process may be performed on a single substrate W, and accordingly, a single substrate W may be loaded onto the process chamber 2100. The substrate W may undergo the wet process using the chemical mixture, a cleaning process, and a dry process, and finally may be unloaded from the process chamber P. Thereafter, a next single substrate may be loaded into the process chamber 2100.

For example, the process chamber 2100 may include a body 2200 having an upper body 2220 defining the process space PS and a lower body 2240 having a discharge line 2241 through which various process solutions and gases may be discharged from the process space PS. The upper body 2240 may be shaped into a bowl and may enclose the spin chuck 2320. The chemical mixture and the cleaning solutions may be prevented from being splashed outwards to surroundings in performing the wet process. The discharge line 2241 may be arranged at a lower portion of the process chamber 2100 and may penetrate through the lower body 2240. The chemical mixture and the cleaning solution that may be gathered at the bottom of the upper body 2220 may be discharged from the process space PS of the process chamber 2100.

The chemical supplier 2500 may include a plurality of source tanks 2510 containing chemical sources, respectively, a chemical reservoir 2560 connected to the source tanks 2510 through a plurality of source feed lines 2544 and 2546, respectively, and in which the chemical sources are mixed to thereby form the chemical mixture, an inline heater 2591 heating the chemical mixture to a process temperature, and an chemical nozzle 2520 injecting the chemical mixture onto the substrate W in the process chamber 2100.

The chemical mixture may be on standby at a room temperature in the chemical reservoir 2560 and may be supplied into the process chamber 2100 after being heated to the process temperature. The chemical sources may be fed into the chemical reservoir 2560 at the room temperature and may be mixed with one another in the chemical reservoir 2560 under the room temperature, so that the chemical mixture may be contained in the chemical reservoir 2560 at the room temperature. The chemical mixture may be heated by the inline heater 2591 while the chemical mixture is moved to the process chamber through a supply line 2548. The chemical mixture may be injected onto the substrate W at the process temperature, which is higher than the room temperature. Heat loss of the chemical mixture through the supply line 2548 may be compensated for by the temperature compensator just before the chemical mixture is injected onto the substrate W. The chemical supplier 2500 may have substantially the same structure as the chemical supplier 1000 as shown in FIG. 1, and thus descriptions of similar features of the chemical supplier 2500 will not be repeated.

The chemical mixture may be on standby in the closed chemical reservoir 2560 at the room temperature. Accordingly, evaporation of the compositions of the chemical mixture may be sufficiently prevented or reduced, which may help to minimize a property change of the chemical mixture. Accordingly, the lifetime of the chemical mixture may be prolonged in the wet process, and the consumption of the chemical mixture for the wet process may be minimized. In addition, the chemical mixture may be on standby at the room temperature. Accordingly, an internal circulation circuit for heating the chemical mixture in standby state may not be needed in the wet process apparatus 3000, which may help to reduce the operation cost of the wet process apparatus 3000.

The cleaning solution supplier 2400 may supply the cleaning solution to the substrate W after the injection of the chemical mixture, thereby removing the residuals of the chemical mixture from the substrate W. For example, the cleaning solution supplier 2400 may include a cleansing solution nozzle 2420, a cleaning solution supply line 2440, and a cleaning solution reservoir 2620. For example, de-ionized water may be contained in the cleaning solution reservoir 2620 as the cleaning solution and the de-ionized water may be injected onto the rotating substrate W through the cleaning solution nozzle 2420 after the injection of the chemical mixture. Thus, the residuals of the chemical mixture may be cleaned off from the substrate W.

According to implementations, the wet process apparatus 3000 may further include a dry fluid supplier 2800. The dry fluid supplier may supply a dry fluid for drying the substrate W after the cleaning process. For example, the dry fluid supplier 2800 may include a dry fluid nozzle 2820, a dry fluid supply line 2840, and a dry fluid generator 2860. For example, isopropyl alcohol may be generated and contained in the dry fluid generator 2860 and may be injected through the dry fluid nozzle 2820 onto the substrate W from which the residuals of the chemical mixture may be removed by the cleaning solution. After completing the dry process, the substrate W may be unloaded from the process chamber 2100 and may be stacked in a substrate transfer such as a wafer cassette.

While the present example embodiment discloses that the dry fluid supplier 2800 is arranged together with the cleaning solution supplier 2400, variable modifications may be allowable to the structures and configurations of the wet process apparatus 3000. For example, the dry fluid supplier 2800 may be integrally provided with the process chamber 2100. In other implementations, an additional chamber other than the process chamber 2100 may be provided as a dry chamber (not shown) and the dry fluid supplier 2800 may be connected to the dry chamber.

The dry fluid supplier 2800 and the cleaning solution supplier 2400 may be provided together with each other in one body. Accordingly, both of the cleaning solution nozzle 2420 and the dry fluid nozzle 2820 may be operated by a first driver 2480 and the chemical nozzle 2520 may be operated by a second driver 2580. The first driver 2480 may include a first horizontal arm 2482, a first rod 2484, and a first motor 2486. The second driver 2580 may include a second horizontal arm 2582, a second rod 2584, and a second motor 2586. The first and the second rods 2484 and 2584 may be directly connected to the respective first and the second motors 2486 and 2586, and thus may be rotated according to a respective central axis thereof. The first arm 2482 may be connected to the first rod 2484 and to the cleaning solution nozzle 2420 and the dry fluid nozzle 2820, such that the relative position of the nozzles 2420 and 2820 with respect to the substrate W may be accurately controlled by the first motor 2486. In the same way, the second arm 2582 may be connected to the second rod 2484 and to the chemical nozzle 2520, such that the relative position of the chemical nozzle 2520 with respect to the substrate W may be accurately controlled by the second motor 2586.

The chemical supplier 2500, the cleaning solution supplier 2400, and the dry fluid supplier 2800 may be connected to a controller 2600, and thus may be individually controlled by the controller 2600 according to stages of the wet process in the wet process apparatus 3000.

For example, the controller 2600 may be individually connected to a first valve 2542 of a driving unit of the chemical supplier 2500, a second valve 2442 of a driving unit of the cleaning solution supplier 2400, and a third valve 2842 of a driving unit of the dry fluid supplier 2800. Thus, a proper amount of the chemical mixture, the cleaning solution, and the dry fluid may be automatically supplied into the process chamber 2100 according to the stage of the wet process. In addition, the first and the second source tanks 2511 and 2512 may also be connected to the controller 2600, and thus, the amount of the first and the chemical sources that may be fed to the chemical reservoir 2560 may also be controlled by the controller 2600. The compositions and the concentration of the chemical mixture may be determined by the controller 2600. Further, the inline heater 2591 may be controlled by the controller 2600, so that the process temperature of the chemical mixture may be determined and checked by the controller 2600.

While the present example embodiment discloses that the chemical mixture, the cleaning solution, and the dry fluid are supplied to an upper portion of the process chamber 2100, the cleaning solution and the dry fluid may also be supplied to a lower portion the process chamber 2100 in accordance with operation conditions and installation requirements of the wet process apparatus 3000.

Figure 7:
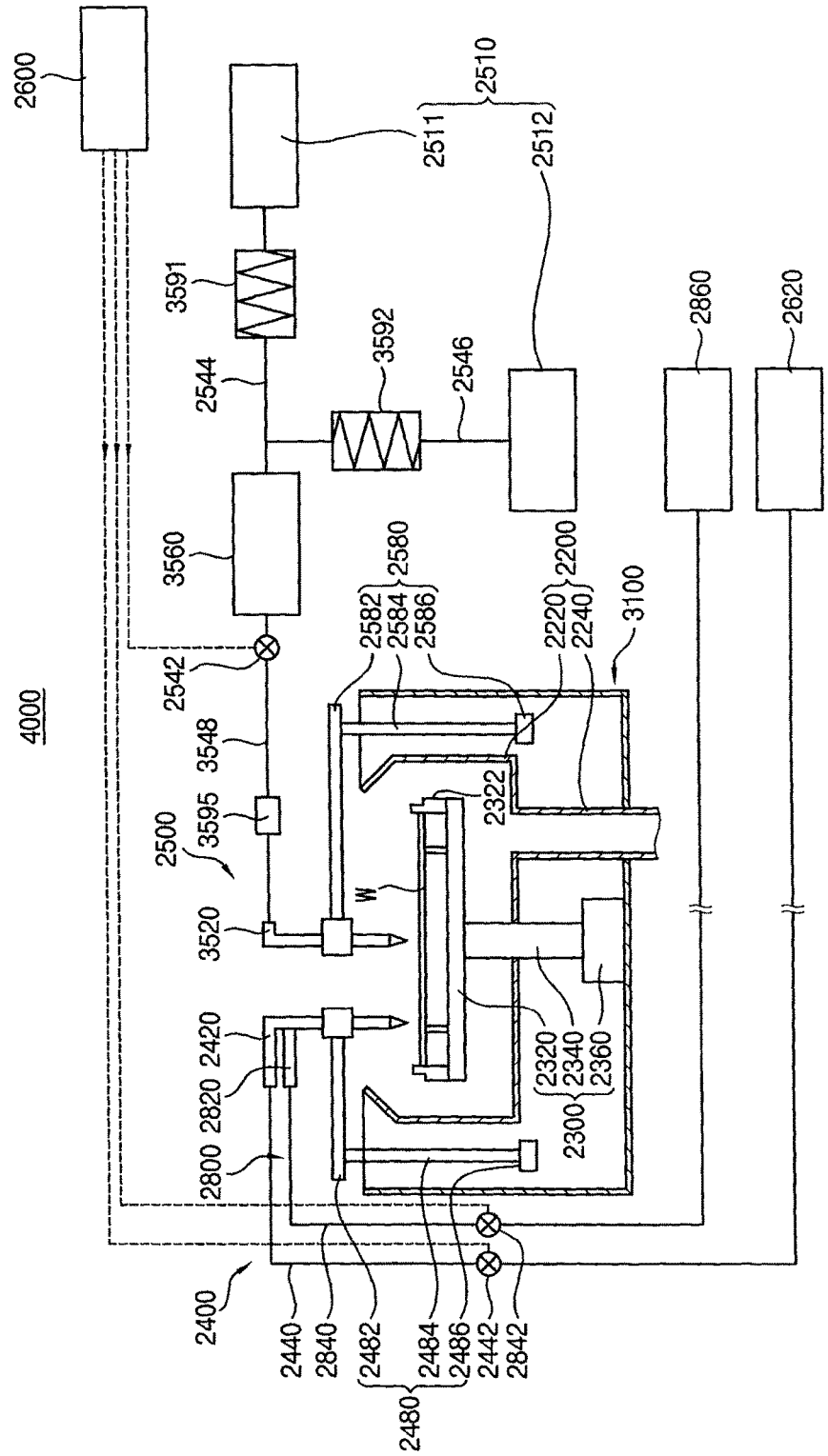
FIG. 7 illustrates a structural view depicting an apparatus for performing a wet process having the chemical supplier shown in FIG. 4.

FIG. 7 illustrates a structural view depicting an apparatus for performing a wet process having the chemical supplier shown in FIG. 4. The wet process apparatus shown in FIG. 7 may have substantially the same structures as the wet process apparatus shown in FIG. 6, except for the configuration of the chemical supplier. Thus, the wet process apparatus shown in FIG. 7 will be described with reference to the chemical supplier of FIG. 4. Features having the same structure as corresponding features in FIG. 6 are identified by the same reference characters used in FIG. 6.

Referring to FIG. 7, an apparatus 4000 for performing a wet process (hereinafter referred to as wet process apparatus) in accordance with another example embodiment may include first and second inline heaters 3591 and 3592 for heating the chemical sources while the chemical sources are fed to a chemical reservoir 3560. Thus, the chemical mixture may be contained in the chemical reservoir 3560 at a high temperature.

The chemical sources may be heated to about the process temperature before reaching the chemical reservoir 3560. Accordingly, the chemical mixture may be on standby at the process temperature. Thus, the chemical mixture may not need to be heated in the process chamber under the standby state, which may help to reduce the operation cost of the chemical supplier 3500. The chemical reservoir 3560 may be covered by a cover and be sufficiently separated from surroundings. Thus, evaporation of the chemical mixture may be minimized in spite of the process temperature being higher than the room temperature. The properties of the chemical mixture may hardly change, and the lifetime of the chemical mixture may be prolonged in the wet process apparatus 4000.

A temperature compensator 3595 may be further provided to the supply line 3548 adjacent to the process chamber 3100, and thus may compensate for heat loss of the chemical mixture through the supply line 3548. Heat loss of the chemical mixture during the movement from the chemical reservoir 3560 to the chemical nozzle 3520 may be sufficiently compensated for and the temperature of the chemical mixture may be close to the process temperature just before the chemical mixture is injected onto the substrate W.

No inline heater may be provided to the supply line 3548 in the wet process apparatus 4000. Accordingly, the length of the supply line 3548 may be reduced as much as possible, and thus, the heat loss through the supply line 3548 may be minimized. As a result, the chemical reservoir 3560 may be positioned adjacent to the process chamber 3100. In such a case, when a plurality of the process chambers 3100 are provided in the wet process apparatus 4000, a plurality of the chemical reservoirs 3560 may be provided in such a configuration that the chemical reservoirs 3560 may correspond to the process chambers 3100 on a one-to-one basis.

Figure 8:
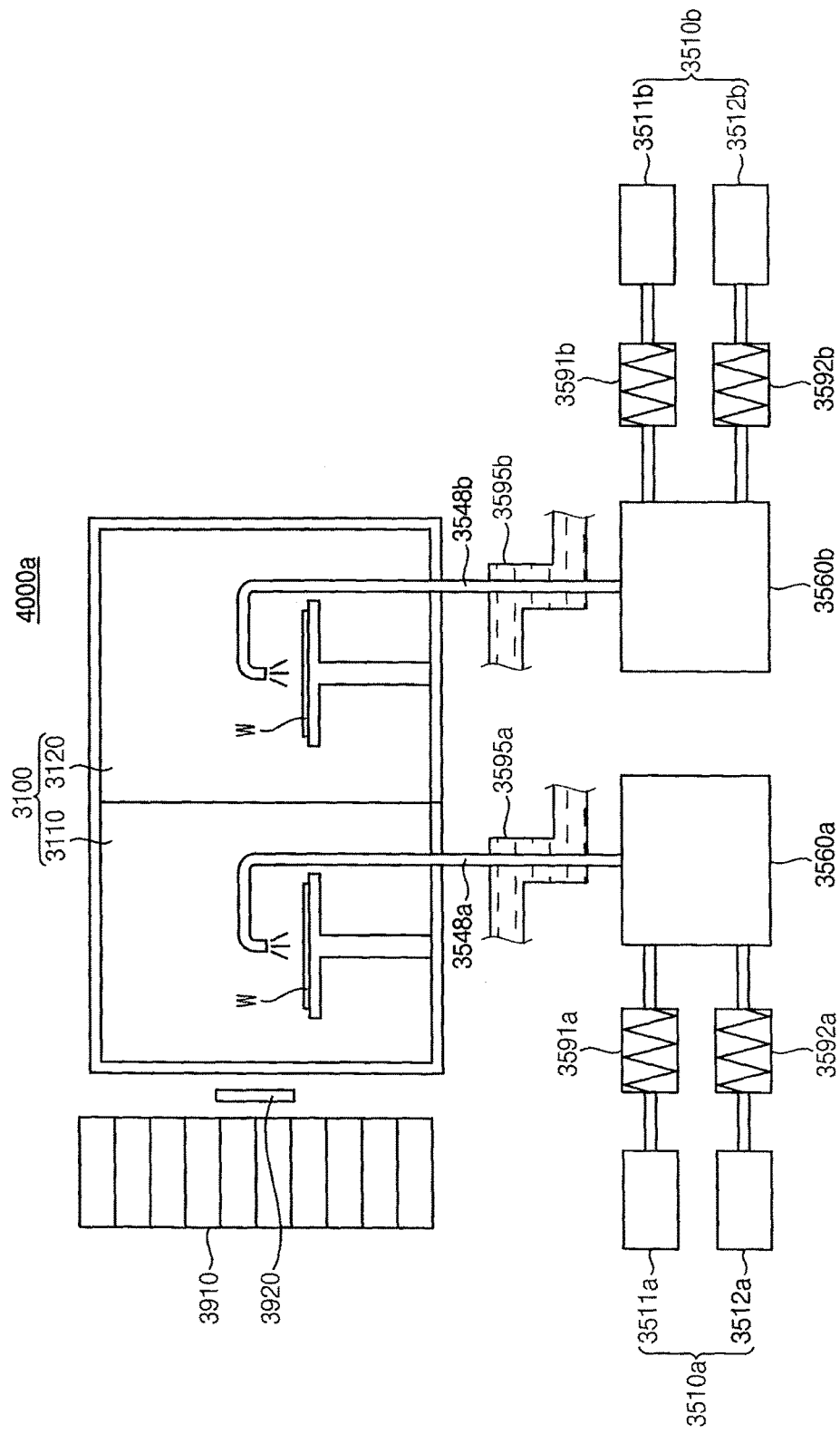
FIG. 8 illustrates a structural view depicting a modification of an apparatus for performing a wet process shown in FIG. 7.

FIG. 8 illustrates a structural view depicting a modification of the apparatus for performing a wet process shown in FIG. 7. In FIG. 8, while the chemical mixture may be disclosed to be supplied through a bottom portion of a process chamber, any other portions of the process chamber such as a top portion could be used for supplying the chemical mixture in view of the usage conditions and installation requirements of the wet process apparatus.

Referring to FIG. 8, wet process apparatus 4000a may differ from the wet process apparatus illustrated in FIG. 7 by including a first process chamber 3110, a first chemical reservoir 3560a connected to the first process chamber 3110, a second process chamber 3120, and a second chemical reservoir 3560b connected to the second process chamber 3120. The first chemical reservoir 3560a may be connected to first source tanks 3510a, and the second chemical reservoir 3560b may be connected to second source tanks 3510b. The first chemical sources in the first source tanks 3510a may be heated by first inline heaters 3591a and 3592a, and a first chemical mixture may be contained in the first chemical reservoir 3560a at a first process temperature. The second chemical sources in the second source tanks 3510b may be heated by second inline heaters 3591b and 3592b and a second chemical mixture may be contained in the second chemical reservoir 3560b at a second process temperature. Thus, the first chemical mixture may be the same as the second chemical mixture or may be different from the second chemical mixture.

Thus, a first wet process using the first chemical mixture may be performed in the first process chamber 3110 and a second wet process using the second chemical mixture may be performed in the second process chamber 3120. The first wet process may be performed independently from the second wet process in the wet process apparatus 4000. Accordingly, a plurality of the wet processes may be performed independently from one another under the individual process conditions in the same wet process apparatus 4000. For example, the composition, the concentration, and the mass flux of the first chemical mixture may be different from those of the second chemical mixture. A first temperature compensator 3595a may be provided on a first supply line 3548a, and a second temperature compensator 3595b may be provided on a second supply line 3548b. Thus, the temperature of the first and the second chemical mixtures may be individually controlled to be close to the first and the second process temperatures, respectively.

A cassette 3910 and a transfer unit 3920 may be positioned at a side of the wet process apparatus 4000a. A plurality of the substrate W may be stacked in the cassette 3910 and the substrate W in the cassette 3910 may be loaded into the process chamber 3100 by the transfer unit 3920. Further, when the wet process is completed with respect to the substrate in the process chamber 3510, the processed substrate may be unloaded into the cassette 3910 by the transfer unit 3920. For example, the substrate W may include a semiconductor substrate such as a wafer, and the cassette 3910 may include a wafer cassette. The transfer unit 3920 may include a robot arm that is controlled by the controller 3600.

According to example embodiments of the wet process apparatus, the chemical mixture may be on standby at a room temperature in the closed chemical reservoir and may be heated to the process temperature while being moved to the process chamber. Thus, the chemical mixture may not need to be heated in the standby state, and it may not be necessary to install an internal circulation circuit in the chemical reservoir for heating the chemical mixture in the wet process apparatus. Accordingly, the operation cost of the wet process apparatus may be reduced. In addition, the chemical mixture may be on standby at the process temperature in the closed chemical reservoir without evaporation of the chemical mixture. Thus, the chemical mixture may not need to be heated at the standby state and it may not be necessary to install an internal circulation circuit in the chemical reservoir for heating the chemical mixture in the wet process apparatus. Particularly, a plurality of the process chambers may be connected to a plurality of the chemical reservoirs on a one-to-one basis when a inline heater is not present on the supply line between the process chamber and the chemical reservoir. Accordingly, a plurality of the wet processes may be performed independently from one another under individual conditions in the single wet process apparatus.

Method of Performing a Wet Process in the Wet Process Apparatus

Figure 9:
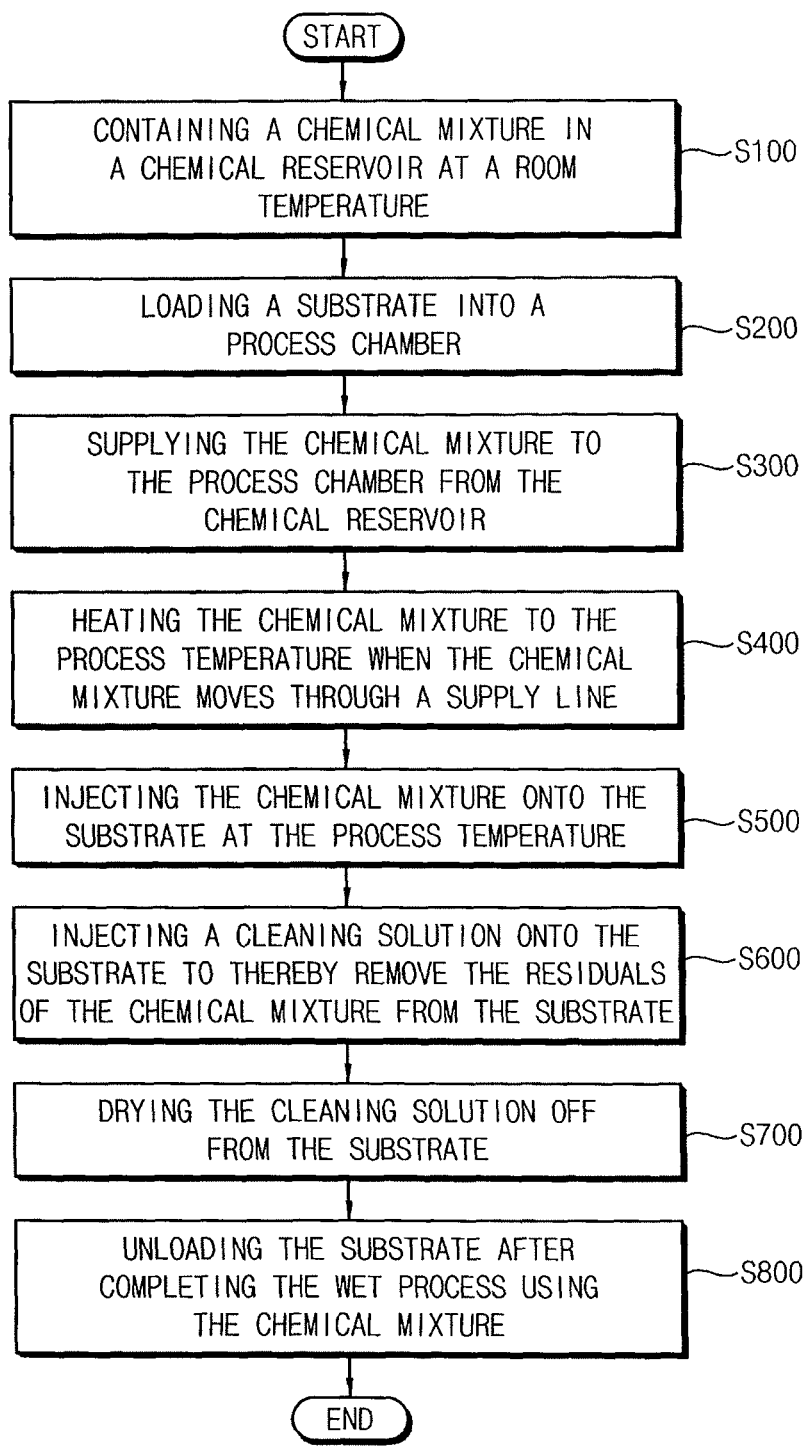
FIG. 9 illustrates a flow chart showing processing stages of a method of performing a wet process on a substrate in accordance with an example embodiment.
Figure 10:
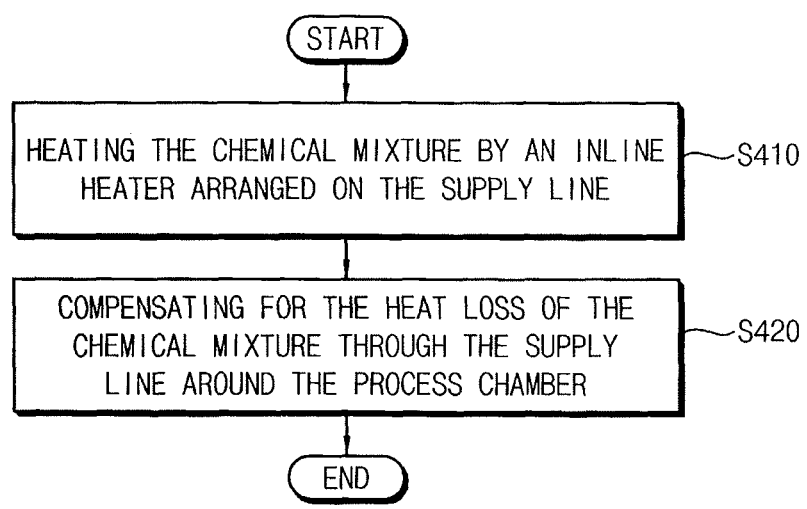
FIG. 10 illustrates a flow chart showing processing sub-stages for the stage of heating a chemical mixture shown in FIG. 9.

FIG. 9 illustrates a flow chart showing processing stages of a method of performing a wet process on a substrate in accordance with an example embodiment, and FIG. 10 is a flow chart showing processing sub-stages for the heating stage of a chemical mixture shown in FIG. 9.

Referring to FIGS. 1, 6, 9 and 10, the chemical mixture C may be contained in the chemical reservoir 2560 at a room temperature (S100) and the substrate W to be processed may be loaded into the process chamber 2100 (S200). The chemical reservoir 2560 may be covered by the cover and thus may be separated or isolated from surroundings.

The substrate W may be individually drawn out of the cassette and may be loaded into the process chamber 2100 by a transfer unit, such as a robot arm. When the wet process is initiated, the valves of the source tanks 2510 may be opened and the chemical sources may be fed into the chemical reservoir 2100 from the source tanks 2510. The chemical sources may be contained in the source tanks 2510 at room temperature. Accordingly, the chemical sources may be mixed with one another at room temperature in the chemical reservoir 2560, thereby forming the chemical mixture in the reservoir 2560 at room temperature. The chemical reservoir 2560 may be covered by the cover and thus may be sufficiently separated from the surroundings. In addition, the pressure control gases may be fill up an empty portion of the inner space of the reservoir 2560, such that an inner pressure may be applied to the chemical mixture in the chemical reservoir 2560. Thus, the chemical mixture may be sufficiently prevented from evaporating. Accordingly, the property changes of the chemical mixture may be prevented and the lifetime of the chemical mixture may be sufficiently prolonged.

Then, the chemical mixture C may be discharged from the chemical reservoir 2560 and may be supplied to the process chamber 2100 (S300). For example, a pulling pressure may be applied to a lower portion of the chemical mixture C from an exterior of the chemical reservoir 2560 by the pulling pressure applier, and thus, the chemical mixture C may be pulled outwards from the chemical reservoir 2560. In other implementations, a pushing pressure may be applied to an upper portion of the chemical mixture C in the chemical reservoir 2560 by the pushing pressure applier, and thus, the chemical mixture C may be pushed out from the chemical reservoir 2560.

In the present example embodiment, the pulling pressure may be applied to the lower portion of the chemical mixture by an air pump that controls the amount of the chemical mixture flowing in the supply line 2548. The inner pressure of the chemical reservoir 2560 may be controlled to be sufficiently high to push and move the chemical mixture C to the process chamber 2100, which may help to increase the flow speed of the chemical mixture C in the supply line 2548.

When the chemical mixture C is moved to the process chamber 2100 through the supply line 2548, the chemical mixture C may be heated to the process temperature (S400). The chemical mixture C may be heated by the inline heater 2591 that may be arranged on the supply line 2548 (S410). Then, the heated chemical mixture C may reach the chemical nozzle 2520. According to an implementation, the temperature compensator 2595 may compensate for the heat loss of the chemical mixture through the supply line 2548 (S420). For example, the supply line 2548 adjacent to the process chamber 2100 may be reheated by the temperature compensator 2595, thereby compensating for the heat loss of the chemical mixture C through the supply line 2548. In the present example embodiment, a heat compensation fluid F having a temperature higher than the chemical mixture C may flow through the additional pipe, and the chemical nozzle 2520 or the supply line 2548 may penetrate through the additional pipe. Thus, heat may be transferred to the chemical mixture C from the heat compensation fluid F in the additional pipe, thereby compensating for the heat loss of the chemical mixture C. Therefore, the temperature of the chemical mixture C may be controlled to be close to the process temperature.

Then, the chemical mixture C may be injected onto the substrate W at the process temperature (S500), and the wet process may be performed on the substrate W in the wet process apparatus 3000. Thereafter, a cleaning solution such as the de-ionized water may be injected onto the substrate W, and the residual chemical mixture C may be removed from the substrate W (S600). When the residual chemical mixture C is sufficiently removed from the substrate W, the dry fluid may be supplied onto the substrate W by the dry fluid supplier 2800 and the cleaning solution may be dried removed from the substrate W by drying (S700). After completing the wet process by using the chemical supplier 1000, the substrate W may be unloaded from the process chamber 2100 and may be stacked in the cassette. The injection of the chemical mixture C, the injection of the cleaning solution and the injection of the dry fluid may be individually controlled by the controller 2600 according to the processing steps of the wet process.

Figure 11:
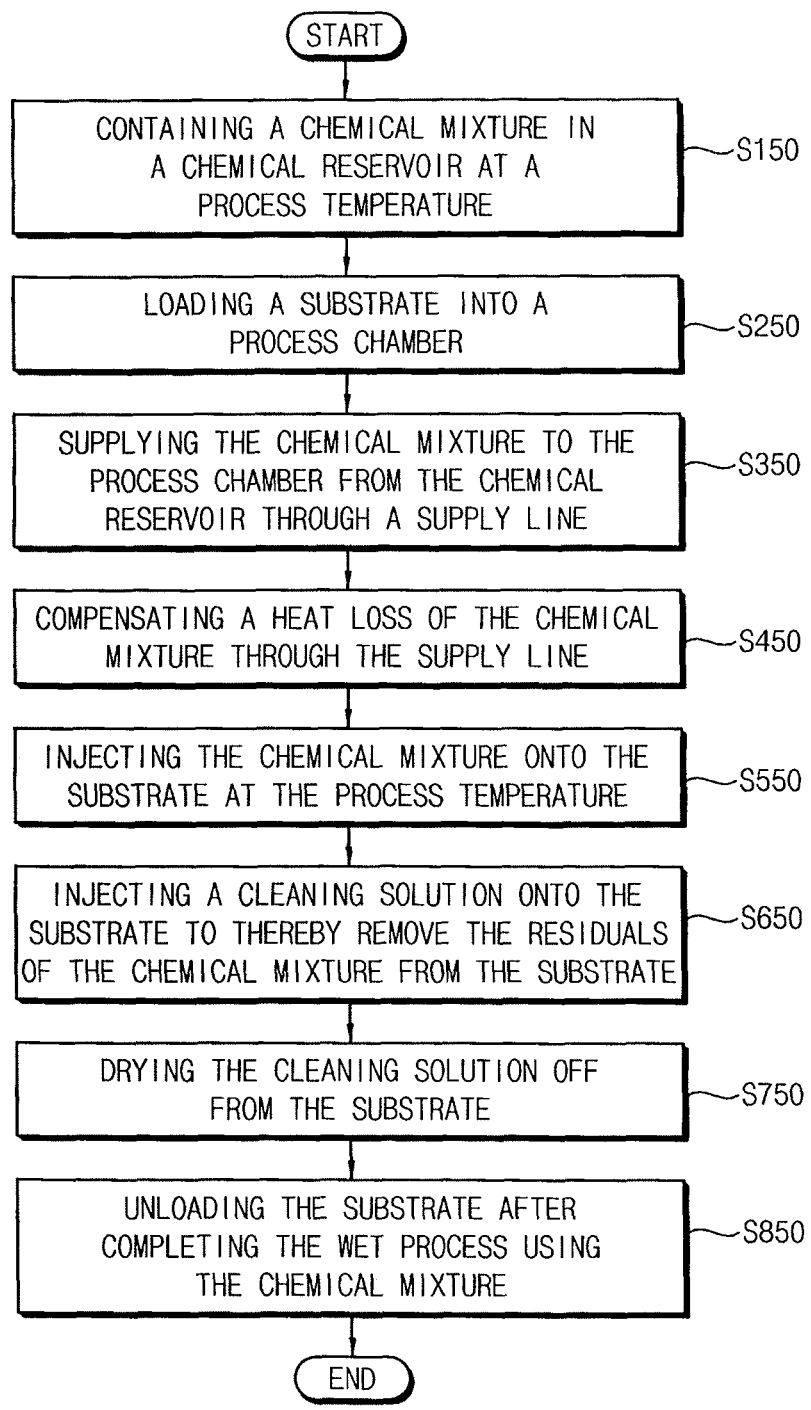
FIG. 11 illustrates a flow chart showing processing stages for a method of performing a wet process on a substrate in accordance with another example embodiment.
Figure 12:
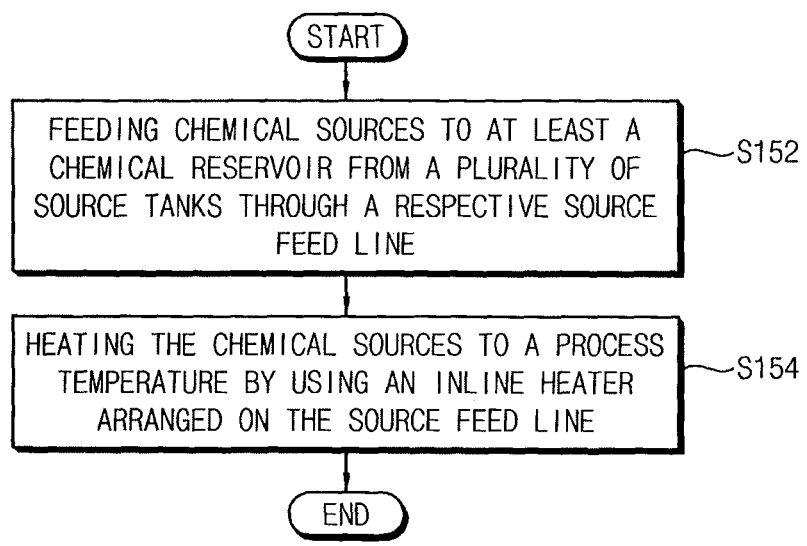
FIG. 12 illustrates a flow chart showing processing sub-stages for the stage of containing a chemical mixture in the chemical reservoir at a process temperature shown in FIG. 11.

FIG. 11 illustrates a flow chart showing processing stages for a method of performing a wet process on a substrate in accordance with another example embodiment, and FIG. 12 is a flow chart showing processing sub-stages for the stage shown in FIG. 11 of containing a chemical mixture in the chemical reservoir at a process temperature.

Referring to FIGS. 4, 7, 11 and 12, the chemical mixture C may be contained in the chemical reservoir 3560 at a process temperature higher than the room temperature (S150) and the substrate W to be processed may be loaded into the process chamber 3100 (S250). The chemical reservoir 2560 may be covered by the cover and thus may be separated or isolated from surroundings.

The chemical sources S1 and S2 may be fed to the chemical reservoir 3560 from the first and the second source tanks 3511 and 3512 through the respective source feed lines 3544 and 3546 (S152). In such a case, a plurality of the process chambers 3100 may be provided in the wet process apparatus 4000. The chemical sources S1 and S2 may be heated to the process temperature by the first and the second inline heaters 3591 and 3592, respectively while flowing through the source feed lines 3544 and 3546 (S154). The inline heaters 3591 and 3592 may be arranged on the respective source feed lines 3544 and 3546. For example, the chemical sources S1 and S2 may be discharged from the source tanks 3511 and 3512 by a vacuum pump t arranged on the source feed lines 3544 and 3546. The vacuum pump may include a flux controller for controlling a mass flux of the chemical sources S1 and S2.

A temperature compensator may be arranged on the source feed lines 3544 and 3546 to compensate for heat loss of the chemical sources S1 and S2 through the respective source feed lines 3544 and 3546. Thus, the temperature of the chemical sources S1 and S2 may be accurately controlled to be at or near the process temperature.

The chemical reservoir 3560 may be covered by the cover and thus may be sufficiently separated from the surroundings. In addition, pressure control gases may fill up an empty portion of the inner space of the reservoir 3560, such that an inner pressure may be applied to the chemical mixture C in the chemical reservoir 3560. Thus, the chemical mixture C may be sufficiently prevented from evaporating. Accordingly, the property changes of the chemical mixture C may be prevented and the lifetime of the chemical mixture may be sufficiently prolonged.

Then, the chemical mixture C may be discharged from the chemical reservoir 3560 and may be supplied to the process chamber 3100 (S350). For example, a pulling pressure may be applied to a lower portion of the chemical mixture C from an exterior of the chemical reservoir 3560 by the pulling pressure applier, and thus, the chemical mixture C may be pulled outwards from the chemical reservoir 3560. In other implementations, a pushing pressure may be applied to an upper portion of the chemical mixture C in the chemical reservoir 3560 by the pushing pressure applier, and thus, the chemical mixture C may be pushed out from the chemical reservoir 3560. Another temperature compensator 3595 may be arranged on the supply line 3548 to compensate for heat loss of the chemical mixture C through the source supply line 3548 (S450). Thus, the temperature of the chemical mixture C may be accurately controlled to be close to the process temperature just before the chemical mixture C is injected onto the substrate W.

Then, the chemical mixture C may be injected onto the substrate W at the process temperature (S550), and the wet process may be performed on the substrate W in the wet process apparatus 4000. Thereafter, a cleaning solution such as the de-ionized water may be injected onto the substrate W, and the residual chemical mixture C may be removed from the substrate W (S650). When the residual chemical mixture C is sufficiently removed from the substrate W, a dry fluid may be supplied onto the substrate W by the dry fluid supplier 3800, and the cleaning solution may be removed from the substrate W by drying (S750). After completing the wet process by using the chemical supplier 2000, the substrate W may be unloaded from the process chamber 3100 and may be stacked in the cassette. The injection of the chemical mixture C, the injection of the cleaning solution, and the injection of the dry fluid may be individually controlled by the controller 3600 according to the processing stages of the wet process.

For example, when a plurality of the process chambers 3100 is provided in the wet process apparatus 4000 and each of the process chambers 3100 is individually connected to respective ones of the chemical reservoirs 3560, the controller 3600 may control the source tanks 3510 in such a way that the chemical sources S1 and S2 are fed to each chemical reservoir 3560 at different conditions. That is, the chemical reservoirs 3560 may contain different chemical mixtures C and the process chambers 3560 may be operated independently from one another by using the respective chemical supplier 3500. Accordingly, a plurality of wet processes may be performed independently from one another in the single wet process apparatus 4000.

According to the example embodiments of the wet process apparatus and a method of performing the wet process in the wet process apparatus, inline heaters may be arranged on the supply line for supplying the chemical mixture into the process chamber or on the source feed lines for feeding the chemical sources into the chemical reservoir. The chemical mixture may be controlled to be at a high temperature such as the process temperature right when the wet process is performed. The chemical sources or the chemical mixture may be heated to the high temperature when moving through the source feed lines or through the supply line. Thus, the chemical mixture may not need to be heated at the standby state in which the wet process is not performed, which may help to reduce the operation cost of the chemical supplier. In addition, the chemical reservoir of the chemical supplier may be configured to be a closed system in which the inner space of the reservoir is isolated from surroundings, rather than an open system, which may help to minimize evaporation of the chemical mixture. Therefore, the property changes of the chemical mixture may be avoided, and the lifetime of the chemical mixture may be sufficiently prolonged, which may minimize the consumption of the chemical mixture for the wet process. A plurality of the process chambers may be connected to a plurality of the chemical reservoirs on a one-to-one basis when no inline heater is provided on the supply line between the process chamber and the chemical reservoir. Thus, a plurality of the wet processes may be performed independently from one another under individual conditions in the single wet process apparatus.

The chemical supplier, processing apparatus including the chemical supplier and method of method of processing a substrate using the chemical supper according to example embodiments may be used in the formation of a memory device that may be applied to various electronic systems including semiconductor devices and IC chips such as telecommunication systems and storage systems.

By way of summation and review, in a general wet process, a chemical mixture in a chemical supplier is individually supplied to a respective process chamber at a high temperature through a plurality of supply lines when initiating a substrate treatment process. The high temperature chemical mixture is discharged from the chemical supplier under a high pressure and supplied into the process chamber at a relatively high volume rate, to thereby shorten the supply time of the chemical mixture as rapidly as possible and minimize the heat loss through the supply lines. Therefore, the high temperature chemical mixture is supplied to the process chamber at the very moment when initiating the wet process.

However, the general wet process requires that the chemicals be kept at a high temperature in the chemical supplier under a standby state for being ready for the wet process. Thus, the chemicals need to be circulated through an internal chemical circulation circuit while being periodically heated, which necessarily increases the cost of the wet process. In addition, the compositions of the chemicals are likely to evaporate at the high temperature, and the property of the chemicals may change over time ever after the chemicals are mixed (over the lifetime of the chemical mixture). Thus, the residuals of the chemicals in the chemical supplier and the supply lines need to be removed and wasted after the expiration of the lifetime of the chemical mixture. The residual chemical mixture is usually replaced by new chemical mixture after the lifetime elapses, and the wet process is then performed using the new chemical mixture. Therefore, the chemical mixture is necessarily wasted due to the residuals in the wet process, and the wet process requires much time for completion due to t the replacement time of the chemical mixture.

Accordingly, an improved chemical mixture for the wet process by which the chemical consumption and the process time for the wet process are sufficiently reduced is desirable.

Embodiments provide a chemical supplier in which the chemical mixture is contained at a room temperature and having a line heater for heating the chemical mixture to the high temperature on the supply lines without any heating of the chemical mixture inside the chemical supplier.

Embodiments also provide an apparatus for performing a wet process on a substrate using the above chemical supplier.

Embodiments also provide a method of performing a wet process on a substrate in the above wet process apparatus.

According to embodiments, the inline heaters may be arranged on the supply line for supplying the chemical mixture into the process chamber or on the source feed lines for feeding the chemical sources into the chemical reservoir, and the chemical mixture may be controlled to be under the high temperature such as the process temperature just merely when the wet process may be performed. That is, the chemical sources or the chemical mixture may be heated to the high temperature when moving through the source feed lines or through the supply line. Thus, the chemical mixture may not need to be heated at the standby state in which the wet process may not be performed, which may help to reduce the operation cost of the chemical supplier. In addition, the chemical reservoir of the chemical supplier may be configured to be a closed system in which the inner space of the reservoir may be isolated from surroundings rather than an open system, which may help to minimize the evaporation of the chemical mixture. Therefore, the property changes of the chemical mixture may be prohibited and thus the lifetime of the chemical mixture may be sufficiently elongated, which may minimize the consumption of the chemical mixture for the wet process. Particularly, a plurality of the process chambers may be connected to a plurality of the chemical reservoirs by one-to-one when no inline heater may be provided on the supply line between the process chamber and the chemical reservoir. Thus, a plurality of the wet processes may be performed independently from one another under individual conditions in the single wet process apparatus.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A chemical supplier for a wet process for manufacturing semiconductor devices, comprising:
   a chemical reservoir containing a liquid chemical mixture at a room temperature, the chemical reservoir including:
      a vessel having a source inlet through which chemical sources of the liquid chemical mixture are provided, and a mixture outlet through which the liquid chemical mixture containing the chemical sources is discharged; and
      a cover combined with the vessel such that the vessel is covered with the cover and such that an inner space of the chemical reservoir defined by the vessel and the cover is closed and isolated from surroundings, the cover having a gas inlet valve through which a pressure control gas is supplied into the chemical reservoir, the chemical reservoir having a structure such that the pressure control gas supplied into the chemical reservoir directly contacts the liquid chemical mixture, thereby controlling an inner pressure of the chemical reservoir to prevent evaporation of the liquid chemical mixture and apply a discharging force to the liquid chemical mixture toward the mixture outlet, and a gas outlet valve through which the pressure control gases are discharged from the chemical reservoir, the gas inlet valve and the gas outlet valve being different from the source inlet and the mixture outlet;

a supply line through which the liquid chemical mixture is supplied to a process chamber from the chemical reservoir;

an inline heater positioned on the supply line and heating the liquid chemical mixture in the supply line to a process temperature, the inline heater including:
 a heater body,
 a fine tube provided in the heater body such that a supply line is connected at first and second terminals thereof and through which the liquid chemical mixture flows,
 a heat conductive fluid filling up the heater body and surrounding the fine tube, and
 an electric heater that heats the heat conductive fluid such that heat is transferred from the heat conductive fluid to the fine tube; and a power source driving the liquid chemical mixture to move the liquid chemical mixture toward the process chamber.

2. The chemical supplier as claimed in claim 1, wherein the pressure control gas includes one of argon (Ar) gas and nitrogen ($N_2$) gas.

3. The chemical supplier as claimed in claim 1, further comprising:
 a chemical nozzle provided at an end portion of the supply line over a substrate in the process chamber such that the chemical nozzle injects the liquid chemical mixture onto the substrate, and
 a temperature compensator provided on the supply line adjacent to the process chamber, the temperature compensator compensating for a heat loss of the liquid chemical mixture through the supply line.

4. The chemical supplier as claimed in claim 3, wherein the temperature compensator includes:
 a pipe through which a heat compensation fluid flows, the pipe enclosing the supply line adjacent to the process chamber,
 a heat compensation fluid source positioned at a first end portion of the pipe and containing the heat compensation fluid, and
 a sink positioned at a second end portion of the pipe and receiving the heat compensation fluid.

5. The chemical supplier as claimed in claim 4, wherein the heat compensation fluid includes de-ionized water at a temperature of 70° C. to 100° C.

6. The chemical supplier as claimed in claim 1, wherein the power source includes an air pump by which an amount of the liquid chemical mixture that is supplied into the process chamber is controlled.

7. A chemical supplier for a wet process for manufacturing semiconductor devices, comprising:
 a plurality of source tanks, each source tank of the plurality of source tanks containing a respective chemical source of a plurality of chemical sources;
 a plurality of source feed lines, each source feed line of the plurality of source feed lines being connected to a respective source tank and having a feeding pump thereon, respective ones of the plurality of chemical sources being fed through the respective ones of the plurality of source feed lines by the feeding pump;
 a supply line through which the liquid chemical mixture is supplied to a process chamber from the chemical reservoir;
 a plurality of inline heaters, each inline heater of the plurality of inline heaters being arranged on a respective source feeding line and heating the respective chemical source to a process temperature, each inline heater including:
  a heater body,
  a fine tube provided in the heater body such that the supply line is connected at first and second terminals thereof and through which the liquid chemical mixture flows,
  a heat conductive fluid filling up the heater body and surrounding the fine tube, and
  an electric heater that heats the heat conductive fluid such that heat is transferred from the heat conductive fluid to the fine tube;
 a chemical reservoir connected to the source feed lines and mixing the chemical sources at the process temperature into a liquid chemical mixture, an inner space of the chemical reservoir being separated from surroundings, the chemical reservoir including:
  a vessel having a source inlet through which chemical sources of the liquid chemical mixture are provided, and a mixture outlet through which the liquid chemical mixture containing the chemical sources is discharged;
  a cover combined with the vessel such that the vessel is covered with the cover and an inner space of the chemical reservoir defined by the vessel and the cover is closed and isolated from surroundings, the cover having a gas inlet valve through which a pressure control gas is supplied into the chemical reservoir, the chemical reservoir having a structure such that the pressure control gas supplied into the chemical reservoir directly contacts the liquid chemical mixture, thereby controlling an inner pressure of the chemical reservoir to prevent evaporation of the liquid chemical mixture and apply a discharging force to the liquid chemical mixture toward the mixture outlet, and a gas outlet valve through which the pressure control gases are discharged from the chemical reservoir, the gas inlet valve and the gas outlet valve being different from the source inlet and the mixture outlet; and
 a power source that drives the liquid chemical mixture to move toward the process chamber.

8. The chemical supplier as claimed in claim 7, further comprising a temperature compensator arranged on the supply line adjacent to the process chamber, the temperature compensator compensating for a heat loss of the liquid chemical mixture through the supply line.

9. The chemical supplier as claimed in claim 7, further comprising a chemical nozzle arranged over a substrate at an end portion of the supply line, the chemical nozzle injecting the liquid chemical mixture onto the substrate.

10. The chemical supplier as claimed in claim 9, further comprising a plurality of first temperature compensators, each first temperature compensator of the plurality of first temperature compensators being arranged on a respective source feed line between the inline heater and the chemical reservoir to compensate for a heat loss of the respective chemical source through the respective source feed line.

11. The chemical supplier as claimed in claim 10, further comprising a second temperature compensator arranged on the supply line adjacent to the process chamber, the second temperature compensator compensating for a heat loss of the liquid chemical mixture through the supply line, thereby increasing a temperature of the liquid chemical mixture to the process chamber just before the liquid chemical mixture is injected onto the substrate.

12. An apparatus for performing a wet process, the apparatus comprising:

a process chamber in which a substrate to be processed by a wet process is positioned;

a chemical supplier that supplies a liquid chemical mixture to perform the wet process onto the substrate, the chemical supplier including a chemical reservoir containing the liquid chemical mixture and an inline heater for heating the liquid chemical mixture to a process temperature, the chemical reservoir including:
a vessel having a source inlet through which liquid chemical sources of the chemical mixture are provided, and a mixture outlet through which the liquid chemical mixture containing the chemical sources is discharged; and a cover combined with the vessel such that the vessel is covered with the cover and an inner space of the chemical reservoir defined by the vessel and the cover is closed and isolated from surroundings, the cover having a gas inlet valve through which a pressure control gas is supplied into the chemical reservoir, the chemical reservoir having a structure such that the pressure control gas supplied into the chemical reservoir directly contacts the liquid chemical mixture, thereby controlling an inner pressure of the chemical reservoir to be sufficient to prevent evaporation of the liquid chemical mixture and apply a discharging force to the liquid chemical mixture toward the mixture outlet, and a gas outlet valve through which the pressure control gases are discharged from the chemical reservoir, the gas inlet valve and the gas outlet valve being different from the source inlet and the mixture outlet, and the inline heater including:
a heater body,
a fine tube provided in the heater body through which the liquid chemical mixture flows,
a heat conductive fluid filling up the heater body and surrounding the fine tube, and
an electric heater that heats the heat conductive fluid such that heat is transferred from the heat conductive fluid to the fine tube; and
a cleaning solution supplier that supplies a cleaning solution onto the substrate.

13. The apparatus as claimed in claim 12, wherein the chemical supplier includes a supply line through which the liquid chemical mixture is supplied from the mixture outlet of the chemical reservoir to the process chamber, the inline heater being arranged on the supply line.

14. The apparatus as claimed in claim 13, wherein the supply line is arranged between a single chemical reservoir and a plurality of the process chambers.

15. The apparatus as claimed in claim 12, wherein:
the chemical supplier includes a plurality of source tanks, each source tank of the plurality of source tanks containing a respective chemical source of a plurality of chemical sources, and a plurality of source feed lines, each source feed line of the plurality of source feed lines being connected to a respective source tank and feeding the respective chemical source to the chemical reservoir, and
the inline heater includes a plurality of inline heaters, each inline heater of the plurality of inline heaters being arranged on a respective source feed line such that the chemical sources are heated to a process temperature for the wet process and are mixed with one another into the liquid chemical mixture at the process temperature.

16. The apparatus as claimed in claim 15, wherein:
a plurality of the process chambers and a plurality of the chemical reservoirs are provided in such a configuration that the chemical reservoirs correspond to the process chambers on a one-to-one basis, and
the liquid chemical mixtures in each of the chemical reservoirs have different properties, such that a plurality of the wet processes is performed in each of the process chambers, respectively, independently from one another.

17. The apparatus as claimed in claim 16, further comprising:
a supply line through which respective ones of the liquid chemical mixture are supplied to the corresponding process chamber from the respective chemical reservoir; and
a temperature compensator arranged on the supply line adjacent to the corresponding process chamber and compensating for a heat loss of the respective liquid chemical mixture through the supply line.

18. The apparatus as claimed in claim 12, wherein the substrate includes a plurality of substrates, the apparatus further comprising:
a cassette in which the plurality of the substrates is stacked;
a transfer unit that loads one substrate of the plurality of substrates into the process chamber from the cassette and unloads the one substrate from the process chamber to the cassette; and
a controller that controls the chemical reservoir such that the liquid chemical mixture is injected onto the substrate according to the process steps of the wet process.

19. The apparatus as claimed in claim 12, further comprising a dry fluid supplier that supplies a dry fluid for removing the cleaning solution from the substrate by drying.

20. The apparatus as claimed in claim 19, wherein the dry fluid supplier is integrally arranged with the cleaning solution supplier in one body.

21. A chemical supplier for a wet process for manufacturing semiconductor devices, comprising:
a chemical reservoir containing a liquid chemical mixture at a room temperature, the chemical reservoir including:
a vessel having a source inlet through which liquid chemical sources of the liquid chemical mixture are provided, and a mixture outlet through which the liquid chemical mixture containing the chemical sources is discharged; and
a cover combined with the vessel such that the vessel is covered with the cover and an inner space of the chemical reservoir defined by the vessel and the cover is closed and isolated from surroundings, the cover having a gas inlet valve through which a pressure control gas is supplied into the chemical reservoir, the chemical reservoir having a structure such that the pressure control gas supplied into the chemical reservoir directly contacts the liquid chemical mixture, thereby controlling an inner pressure of the chemical reservoir to be pressure to prevent evaporation of the liquid chemical mixture and apply a discharging force to the liquid chemical mixture, and a gas outlet valve through which the pressure control gases are discharged from the chemical reservoir, the gas inlet valve and the gas outlet valve being different from the source inlet and the mixture outlet;
a supply line through which the liquid chemical mixture is supplied to a process chamber from the chemical reservoir; and an inline heater positioned on the supply line and heating the liquid chemical mixture in the supply line to a process temperature, the inline heater including:
a heater body,
a tube having a coil shape inside the heater body, the supply line being connected to the tube such that the liquid chemical mixture flows through the tube,
a heat transfer member filling up the heater body and surrounding the tube, and
an electric heater that heats the heat transfer member such that heat is transferred to the tube from the heat transfer member.

* * * * *